US010210305B2

(12) United States Patent
Yokochi

(10) Patent No.: US 10,210,305 B2
(45) Date of Patent: Feb. 19, 2019

(54) DEVICE SYSTEM, INFORMATION PROCESSOR, TERMINAL DEVICE, AND DISPLAYING METHOD

(71) Applicant: YOKOGAWA ELECTRIC CORPORATION, Tokyo (JP)

(72) Inventor: Yutaka Yokochi, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 172 days.

(21) Appl. No.: 15/236,830

(22) Filed: Aug. 15, 2016

(65) Prior Publication Data

US 2017/0053048 A1 Feb. 23, 2017

(30) Foreign Application Priority Data

Aug. 18, 2015 (JP) ................................ 2015-160801

(51) Int. Cl.
*G06F 17/50* (2006.01)
*G05B 23/02* (2006.01)

(52) U.S. Cl.
CPC ....... *G06F 17/509* (2013.01); *G05B 23/0272* (2013.01); *G05B 2219/23178* (2013.01)

(58) Field of Classification Search
CPC .............. G06F 17/509; G05B 23/0272; G05B 2219/23178
USPC ............................................................ 703/1
See application file for complete search history.

(56) References Cited

U.S. PATENT DOCUMENTS 5,305,426 A 4/1994 Ushioda et al.
2003/0046027 A1 3/2003 Kitamura et al.
2007/0179645 A1 8/2007 Nixon et al.
2013/0241586 A1 9/2013 Horikawa et al.
2014/0173637 A1 6/2014 Becker et al.
2014/0277619 A1* 9/2014 Nixon .................... G05B 15/02 700/83

(Continued)

FOREIGN PATENT DOCUMENTS

JP 5-151484 A 6/1993
JP 11-167414 A 6/1999
JP A-11-167414 * 6/1999

(Continued)

OTHER PUBLICATIONS

Labview_2006 (Discussion Forums—National Instruments: Multiple Graphs but want one scrollbar, Mar. 1, 2006 downloaded from https://forums.ni.com/t5/LabVIEW/multiple-graphs-but-want-one-scrollbar/td-p/332365).*

*Primary Examiner* — Brian S Cook
(74) *Attorney, Agent, or Firm* — Sughrue Mion, PLLC

(57) ABSTRACT

A device system includes a terminal device which is used by a worker, and an information processor which is connectable to the terminal device through a network. The terminal device includes a designator configured to designate an attentional device among devices included in a plant, and a display configured to display at least two relation diagrams in which the attentional device designated by the designator and a relational device related to the attentional device are shown. The information processor includes a storage which stores relation information representing a relation of the devices, and a generator configured to generate the at least two relation diagrams based on information representing the attentional device designated by the designator and the relation information stored in the storage.

14 Claims, 20 Drawing Sheets

(56) References Cited

U.S. PATENT DOCUMENTS

| | | | |
|---|---|---|---|
| 2017/0122551 | A1 | 5/2017 | Ihara et al. |

FOREIGN PATENT DOCUMENTS

| | | | |
|---|---|---|---|
| JP | 2013-92858 | A | 5/2013 |
| JP | 2014-49047 | A1 | 3/2014 |
| WO | 2012/077210 | A1 | 6/2012 |
| WO | 2015/098364 | A1 | 7/2015 |

* cited by examiner

120

| POSITIONAL RELATION INFORMATION | | | |
|---|---|---|---|
| DEVICE NAME | X | Y | Z |
| TARGET001 | 10 | 20 | 30 |
| TT1002 | 50 | 60 | 70 |
| TT1003 | 12 | 20 | 30 |
| ... | ... | ... | ... |

130

140

220

| PROCESS RELATION INFORMATION | | |
|---|---|---|
| DEVICE NAME | INSTALLED PIPE | UPSTREAM PIPE |
| TARGET001 | 101 | 100 |
| L0012 | 102 | 100 |
| L0011 | 103 | 101 |
| ... | ... | ... |

240

230

320

| CONTROL RELATION INFORMATION | | |
|---|---|---|
| CONTROL LOGIC | Input | Output |
| FIC100 | | TARGET001 |
| FIC100 | FT1001 | |
| TIC100 | TT1001 | |
| TIC100 | | FIC100 |
| ... | ... | ... |

330

340

420

| COMMUNICATION RELATION INFORMATION | |
|---|---|
| DEVICE NAME | UPPER NODE |
| JB101 | I0101 |
| TARGET001 | JB101 |
| FT1002 | JB101 |
| FT1001 | JB101 |
| GW101 | I0102 |
| ... | ... |

| MAIN MEASUREMENT VALUE HISTORY INFORMATION | | | |
|---|---|---|---|
| DEVICE NAME | DATE AND TIME | DATA NAME | DATA VALUE |
| TARGET001 | YY/MM/DD 01:00:00 | TEMP | 999.9 |
| TARGET001 | YY/MM/DD 02:00:00 | TEMP | 999.9 |
| ... | ... | ... | ... |
| TARGET001 | YY/MM/DD 01:00:00 | TEMP | 999.9 |
| ... | ... | ... | ... |
| TT1002 | ... | ... | ... |
| ... | ... | ... | ... |
| TT1003 | ... | ... | ... |
| ... | ... | ... | ... |

| EVENT HISTORY INFORMATION | | |
|---|---|---|
| DEVICE NAME | DATE AND TIME | EVENT |
| TARGET001 | YY/MM/DD 12:15:00 | TEMP HIGH |
| TT1003 | YY/MM/DD 18:30:00 | TEMP HIGH |
| TARGET001 | YY/MM/DD 20:10:00 | TEMP HIGH |
| ... | ... | ... |

| MAIN MEASUREMENT VALUE HISTORY INFORMATION | | | |
|---|---|---|---|
| DEVICE NAME | DATE AND TIME | DATA NAME | DATA VALUE |
| TARGET001 | YY/MM/DD 01:00:00 | ABC | 999.9 |
| TARGET001 | YY/MM/DD 02:00:00 | ABC | 999.9 |
| ... | ... | ... | ... |
| TARGET001 | YY/MM/DD 01:00:00 | DEF | 999.9 |
| ... | ... | ... | ... |
| L0012 | ... | ... | ... |
| ... | ... | ... | ... |
| L0011 | ... | ... | ... |
| ... | ... | ... | ... |
| PI0013 | YY/MM/DD 01:00:00 | GHI | 999.9 |
| ... | ... | ... | ... |

750 (TARGET001 rows), 760 (L0011), 761 (PI0013)

| EVENT HISTORY INFORMATION | | |
|---|---|---|
| DEVICE NAME | DATE AND TIME | EVENT |
| 780 TARGET001 | YY/MM/DD 12:15:00 | ABCDE |
| 790 L0011 | YY/MM/DD 18:30:00 | FGHIJ |
| 781 TARGET001 | YY/MM/DD 20:10:00 | KLMNO |
| 791 PI0013 | YY/MM/DD 22:30:00 | PQRST |
| ... | ... | ... |

| MAIN MEASUREMENT VALUE HISTORY INFORMATION | | | |
|---|---|---|---|
| DEVICE NAME | DATE AND TIME | DATA NAME | DATA VALUE |
| TARGET001 | YY/MM/DD 01:00:00 | ABC | 999.9 |
| TARGET001 | YY/MM/DD 02:00:00 | ABC | 999.9 |
| ... | ... | ... | ... |
| TARGET001 | YY/MM/DD 01:00:00 | DEF | 999.9 |
| ... | ... | ... | ... |
| TT1001 | ... | ... | ... |
| ... | ... | ... | ... |
| FT1001 | ... | ... | ... |
| ... | ... | ... | ... |

| EVENT HISTORY INFORMATION | | |
|---|---|---|
| DEVICE NAME | DATE AND TIME | EVENT |
| TARGET001 | YY/MM/DD 12:15:00 | ABCDE |
| FT1001 | YY/MM/DD 18:30:00 | FGHIJ |
| TT1001 | YY/MM/DD 20:10:00 | KLMNO |
| ... | ... | ... |

880

890

940

950

960

| EVENT HISTORY INFORMATION | | |
|---|---|---|
| DEVICE NAME | DATE AND TIME | EVENT |
| TARGET001 | YY/MM/DD 12:15:00 | ABCDE |
| FT1002 | YY/MM/DD 18:30:00 | FGHIJ |
| FT1001 | YY/MM/DD 20:10:00 | KLMNO |
| ... | ... | ... |

DEVICE SYSTEM, INFORMATION PROCESSOR, TERMINAL DEVICE, AND DISPLAYING METHOD

BACKGROUND

Technical Fields

The disclosure relates to a device system, an information processor, a terminal device, and a displaying method.

Priority is claimed on Japanese Patent Application No. 2015-160801, filed Aug. 18, 2015, the contents of which are incorporated herein by reference.

Related Art

In a plant and a factory (hereinafter, called simply "plant" as a generic name of them), a DCS (Distributed Control System) is established, and an advanced automatic operation is implemented. In the distributed control system, field devices (for example, a measurement device, a manipulation device, a display device, an alarm device, and other devices) and a controller controlling the field devices are connected to each other through a network. Process values which are necessary for a process control are transmitted and received between the controller and the field device.

If an abnormality occurs in the plant, it is necessary for a plant worker to perform suitable operation in accordance with a state of the plant. For example, it is disclosed in Japanese Unexamined Patent Application Publication No. H5-151484 that a plant operating support device diagnoses a plant based on a process value obtained from the plant, and displays an operational guidance for coping with an abnormality based on information obtained by the diagnosis.

The field devices in the plant are associated with various relations, such as a physical positional relation, a process relation, a control relation, and a communication relation. For this reason, if an abnormality occurs in the plant, a factor of the abnormality does not always exist in the field device where the abnormality occurred, and the factor of the abnormality may exist in a peripheral field device.

However, if an abnormality occurs in the plant, the plant operating support device, which is disclosed in Japanese Unexamined Patent Application Publication No. H5-151484, cannot determine a range of field devices where a factor of the abnormality may exist in the plant. For this reason, it is necessary for the plant worker to investigate a field device in which the factor of the abnormality exists, and there is a problem that it is difficult for a worker who has a little knowledge and a little experience to specify a field device in which the factor of the abnormality exists.

SUMMARY

A device system may include a terminal device which is used by a worker, and an information processor which is connectable to the terminal device through a network. The terminal device may include a designator configured to designate an attentional device among devices included in a plant, and a display configured to display at least two relation diagrams in which the attentional device designated by the designator and a relational device related to the attentional device are shown. The information processor may include a storage which stores relation information representing a relation of the devices, and a generator configured to generate the at least two relation diagrams based on information representing the attentional device designated by the designator and the relation information stored in the storage.

Further features and aspects of the present disclosure will become apparent from the following detailed description of exemplary embodiments with reference to the attached drawings.

BRIEF DESCRIPTION OF THE DRAWINGS

FIG. 13 is a drawing illustrating an example of the main measurement value history information stored in the storage.

FIG. 14 is a drawing illustrating an example of the event history information stored in the storage.

FIG. 16 is a drawing illustrating an example of the main measurement value history information stored in the storage.

FIG. 17 is a drawing illustrating an example of the event history information stored in the storage.

FIG. 19 is a drawing illustrating an example of the main measurement value history information stored in the storage.

FIG. 20 is a drawing illustrating an example of the event history information stored in the storage.

DETAILED DESCRIPTION OF THE EMBODIMENTS

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide a device system, an information processor, a terminal device, and a displaying method which can easily specify a device in which a factor of an abnormality exists even if a worker has a little knowledge and a little experience.

Hereinafter, a device system, an information processor, a terminal device, and a displaying method will be described with reference to drawings.

Figure 1:
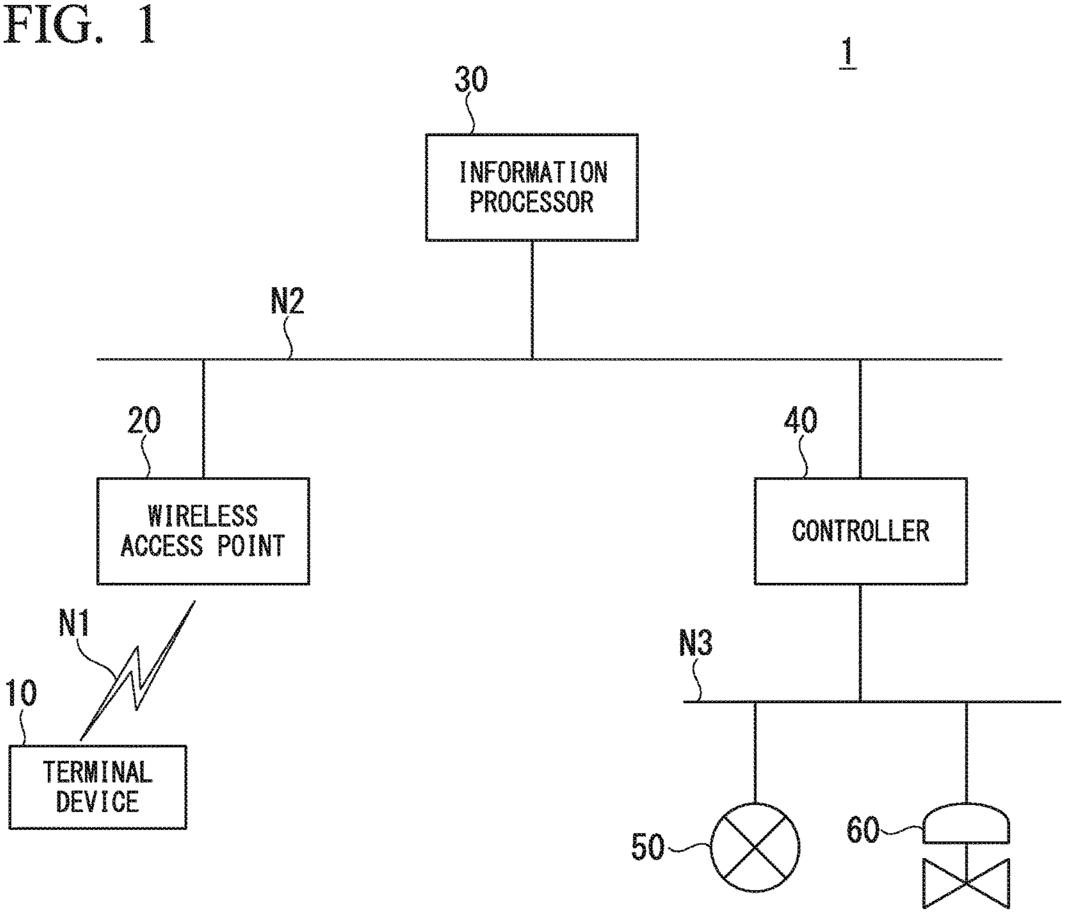
FIG. 1 is a block diagram illustrating a whole configuration of a device system 1.

FIG. 1 is a block diagram illustrating a whole configuration of a device system 1. As shown in FIG. 1, the device system 1 is equipped with a terminal device 10, a wireless access point (or gateway device) 20, an information processor 30, a controller 40, and field devices 50 and 60.

The terminal device 10 and the wireless access point 20 are connected to each other through a wireless network N1. The wireless access point 20 and the information processor 30 are connected to an intranet N2. The wireless network N1 is a wireless network provided in a field of a plant by the wireless access point 20. The wireless network N1 is a wireless network which can perform wireless communication in conformity with wireless communication standards, such as Wi-Fi (registered trademark), WiMAX (registered trademark), 3G/LTE (registered trademark), ISA100.11a, WirelessHART (registered trademark), and so on. The intranet N2 is a network such as Ethernet (registered trademark) installed in a monitoring room of the plant.

The plant includes an industrial plant such as a chemical industrial plant, a plant managing and controlling a wellhead (for example, a gas field and an oil field), a plant managing and controlling a generation of electric power (for example, water power, fire power, and nuclear power), a plant managing and controlling a power harvesting (for example, solar power and wind power), a plant managing and controlling water supply and sewerage systems, a dam, and so on.

The field devices 50 and 60 are such as a sensor device (for example, a flowmeter and a temperature sensor), a valve device (for example, a flow control valve and an on-off valve), an actuator device (for example, a fan and a motor), and other devices installed in the plant. The field devices 50 and 60 are devices controlled by the controller 40. The controller 40 and the field devices 50 and 60 are connected to each other through a field network N3.

In an example of FIG. 1, the field device 50 is shown as a flowmeter, and the field device 60 is shown as a valve device. The controller 40 controls an opening/closing operation of the valve device 60 based on flow quantity of fluid flowing in a pipe, which is measured by the flowmeter 50. The field devices 50 and 60 may be a vibration sensor which monitors vibration of a pipe and a valve device, or may be a noise sensor which monitors sound emitted from an actuator device.

If an abnormality occurs in the plant, a plant worker W investigates a factor of the abnormality. The terminal device 10 is a device used for specifying a field device which is an investigation target, and is used by the plant worker W. For example, the terminal device 10 is a tablet computer, a notebook computer, or a smart phone. However, an arbitrary terminal device, which is equipped with functions required for specifying a field device and displaying, can be used.

Figure 2:
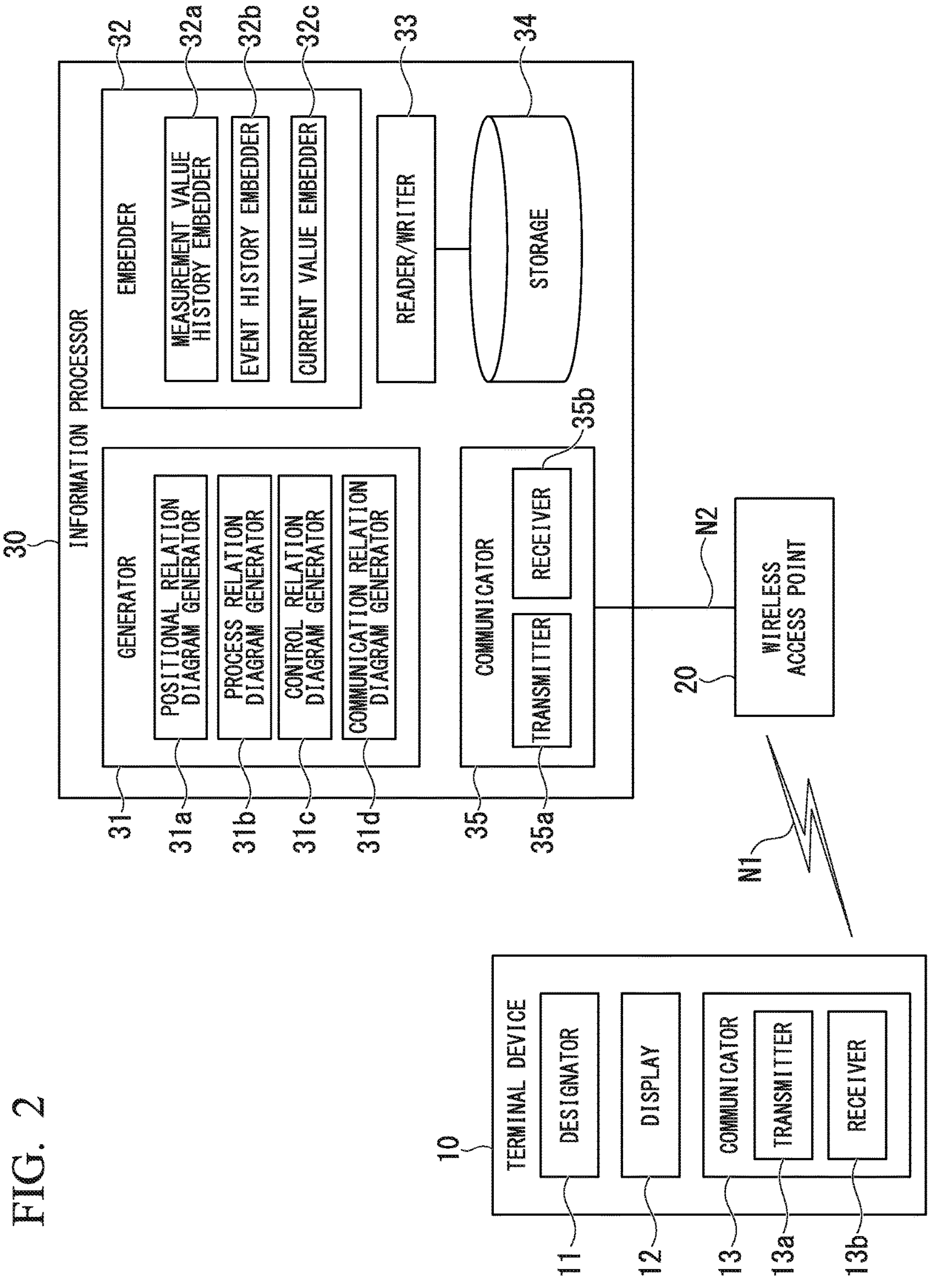
FIG. 2 is a block diagram illustrating a main configuration of the terminal device and the information processor.

FIG. 2 is a block diagram illustrating a main configuration of the terminal device and the information processor. As shown in FIG. 2, the terminal device 10 is equipped with a designator 11, a display 12, and a communicator 13. For example, the designator 11 is a touchpad which receives an input from the plant worker W. If an abnormality occurs in the plant, the plant worker W designates an attentional device out of the field devices included in the plant by using the designator 11. The attentional device is a field device which is an investigation target to be investigated by the plant worker W.

For example, the display 12 is a liquid crystal display, an organic EL (Electro Luminescence) display, or the like. The display 12 displays a relation diagram in which the attentional device specified by the designator 11 and a relational device related to the attentional device are shown. Details of the relation diagram will be described later. The communicator 13 has a transmitter 13*a* which transmits information to the wireless access point 20, and a receiver 13*b* which receives information from the wireless access point 20.

As shown in FIG. 2, the information processor 30 is equipped with a generator 31, an embedder 32, a reader/writer 33, storage 34, and a communicator 35. The generator 31 is equipped with a positional relation diagram generator 31*a*, a process relation diagram generator 31*b*, a control relation diagram generator 31*c*, and a communication relation diagram generator 31*d*. The generator 31 generates a relation diagram which is to be displayed on the display 12. Details of operations of the generators 31*a* to 31*d* will be described later.

The embedder 32 embeds, into a relation diagram, history information which represents a state of the field device (history information of main measurement value and history information of an event which will be described later) and a current value of the main measurement value of the field device. The embedder 32 is equipped with a measurement value history embedder 32*a*, an event history embedder 32*b*, and a current value embedder 32*c*. Details of operations of the embedders 32*a* to 32*c* will be described later.

The reader/writer 33 writes information into the storage 34, and reads information out of the storage 34. The storage 34 stores relation information which represents a relation of field devices, main measurement value history information, and event history information. The details of relation information, main measurement value history information, and event history information will be described later. The communicator 35 has a transmitter 35*a* which transmits information to the wireless access point 20, and a receiver 35*b* which receives information from the wireless access point 20.

For example, the information processor 30 is equipped with a calculation circuit, such as a CPU (Central Processing Unit). The CPU executes a program installed in the information processor 30 (computer) in order to implement functions of the generator 31, the embedder 32, the reader/ writer 33, and so on. These functions may be implemented by hardware, such as an LSI, an ASIC, or the like.

Figures 3, 4:
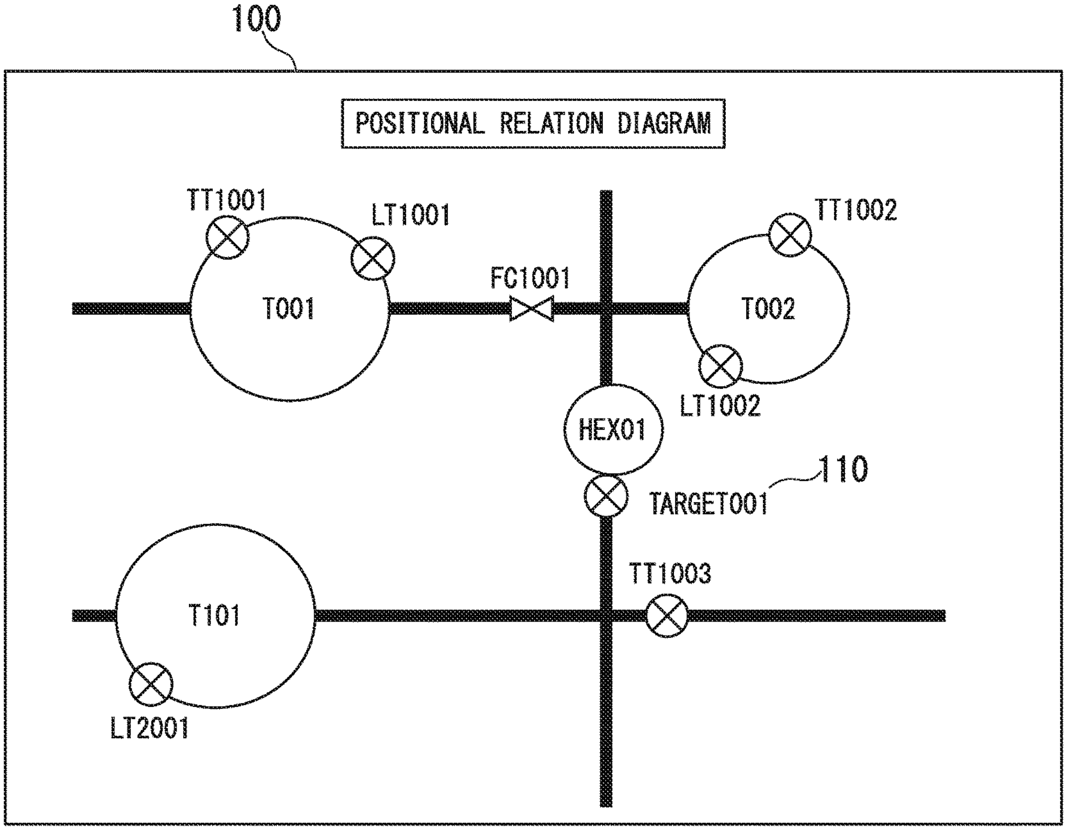
FIG. 3 is a drawing illustrating an example of a positional relation diagram generated by the positional relation diagram generator.
FIG. 4 is a drawing illustrating an example of positional relation information stored in the storage.

FIG. 3 is a drawing illustrating an example of a positional relation diagram generated by the positional relation diagram generator. FIG. 4 is a drawing illustrating an example of positional relation information stored in the storage. Hereinafter, generation processing of a positional relation diagram 100 performed by the positional relation diagram generator 31*a* will be described.

The positional relation diagram generator 31*a* reads positional relation information 120 shown in FIG. 4 out of the storage 34 by using the reader/writer 33. Information of a device name, X coordinate, Y coordinate, and Z coordinate of a position where a field device is installed are included in the positional relation information 120.

As shown in FIG. 3, if the field device of TARGET001 is designated by the designator 11 as an attentional device 110, the positional relation diagram generator 31*a* obtains position information 130 of TARGET001 from the positional relation information 120. The positional relation diagram generator 31*a* extracts field devices, of which distance from TARGET001 is within a predetermined range, based on the position information 140.

Thereafter, the positional relation diagram generator 31*a* reads a diagram, which shows an arrangement relation of field devices in the plant, out of the storage 34 by using the reader/writer 33. As shown in FIG. 3, based on the read diagram, the positional relation diagram generator 31*a* generates the positional relation diagram 100 in which TARGET001 (attentional device) and a field device (relational device) of which distance from TARGET001 is within a predetermined range are included. The positional relation diagram generator 31*a* may emphasize the attentional device and the relational device by using color different from the other field devices.

Figure 5:
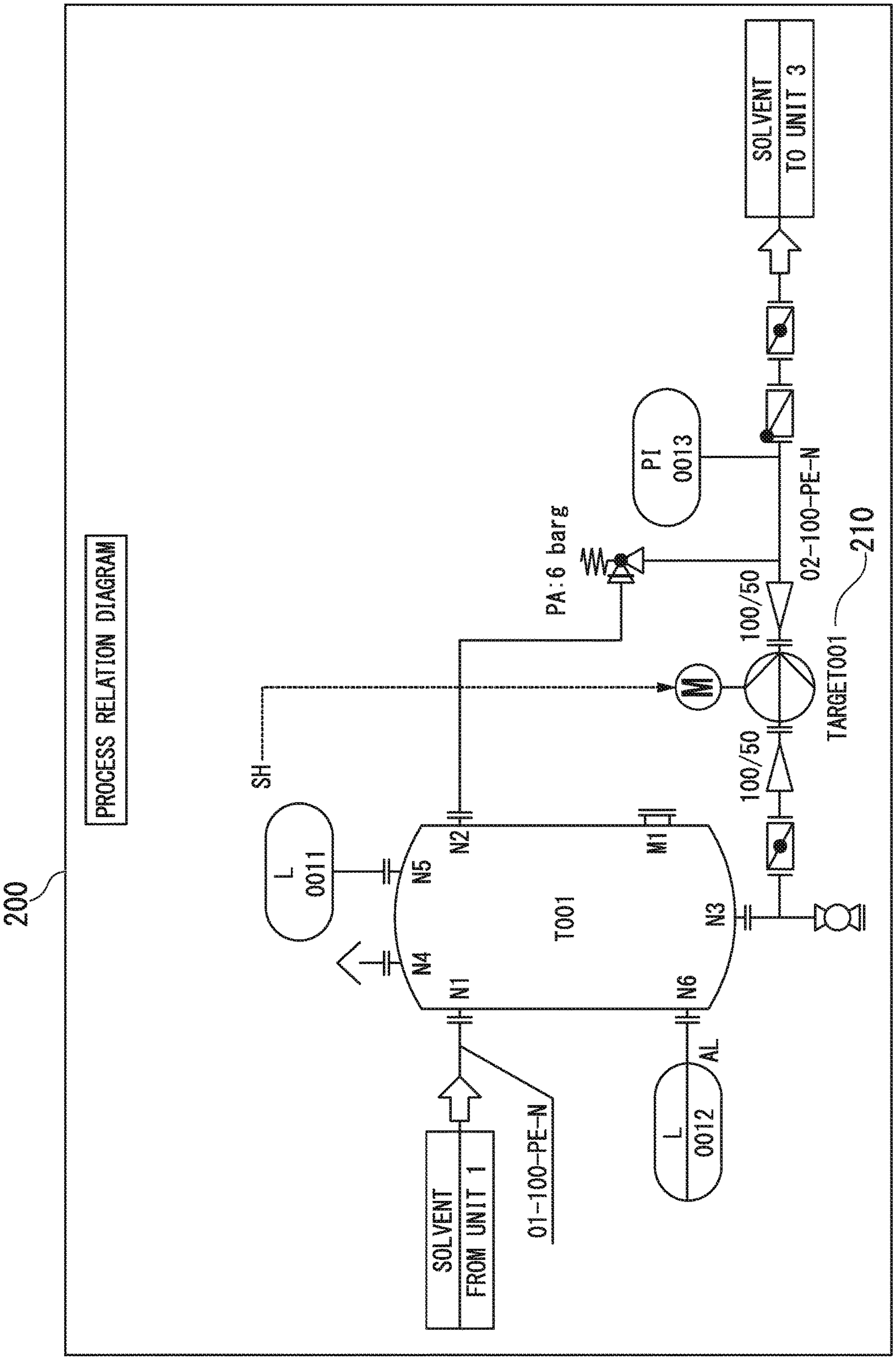
FIG. 5 is a drawing illustrating an example of a process relation diagram generated by the process relation diagram generator.
Figures 6, 7:
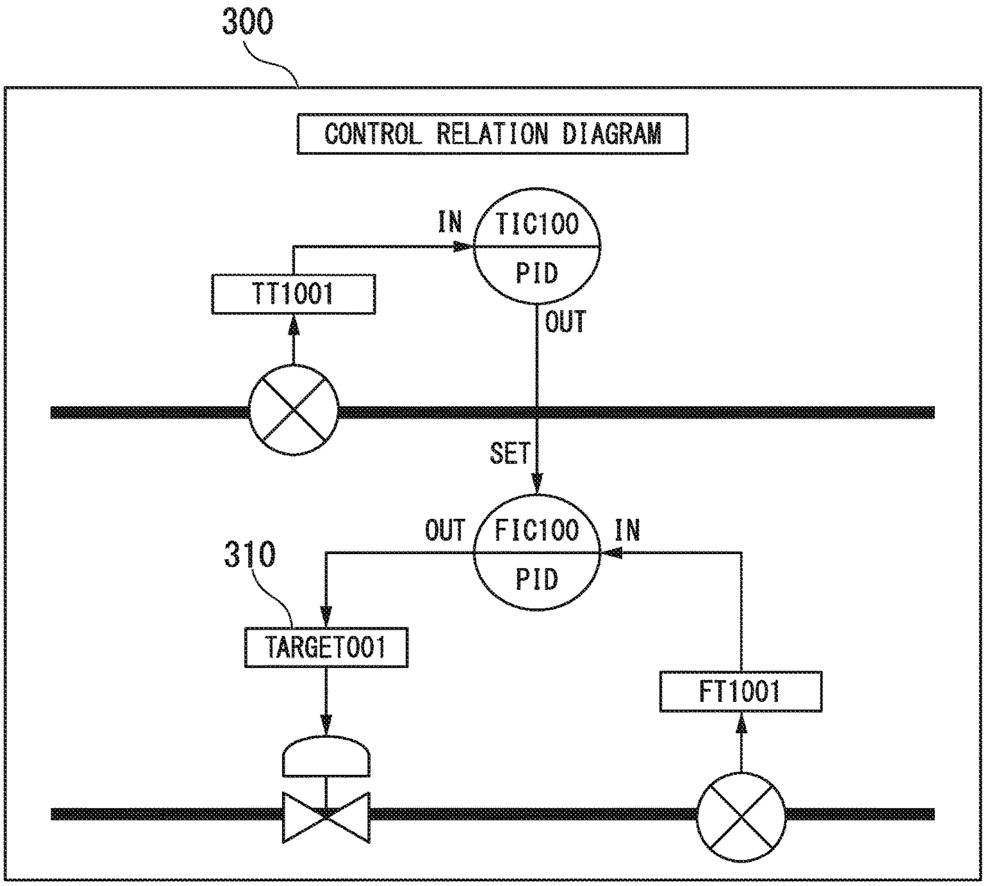
FIG. 6 is a drawing illustrating an example of process relation information stored in the storage.
FIG. 7 is a drawing illustrating an example of a control relation diagram generated by the control relation diagram generator.

FIG. 5 is a drawing illustrating an example of a process relation diagram generated by the process relation diagram generator. FIG. 6 is a drawing illustrating an example of process relation information stored in the storage. Hereinafter, generation processing of a process relation diagram 200 performed by the process relation diagram generator 31*b* will be described.

The process relation diagram generator 31*b* reads process relation information 220 shown in FIG. 6 out of the storage 34 by using the reader/writer 33. Information of a device name, information of a pipe on which a field device is mounted, and information of a pipe prepared on upstream of the pipe are included in the process relation information 220.

As shown in FIG. 5, if the field device of TARGET001 is designated by the designator 11 as an attentional device 210, the process relation diagram generator 31*b* extracts a field device which has a connection relation of process to TARGET001. Specifically, as shown in FIG. 6, the process relation diagram generator 31*b* obtains information 230 of a pipe (here, the pipe 101) on which TARGET001 is mounted from the process relation information 220. As shown by the reference sign 240, the process relation diagram generator 31*b* searches a field device of which upstream pipe is the pipe 101. In the example of FIG. 6, the field device of L0011 is extracted by the search. Moreover, the device name of which installed pipe is the pipe 100 which is an upstream pipe of TARGET001 may be searched and extracted.

Thereafter, the process relation diagram generator 31*b* reads a diagram, which shows a connection relation of process of field devices in the plant, out of the storage 34 by using the reader/writer 33. As shown in FIG. 5, based on the read diagram, the process relation diagram generator 31*b* generates the process relation diagram 200 in which TARGET001 (attentional device) and a field device (relational device) which has the connection relation of process to TARGET001 are included. Although it has been described that the search is performed based on a pipe on which the field device is mounted as the connection relation of process, for example, field devices mounted on a tank T001 shown in FIG. 5 may be searched.

Figures 8, 9:
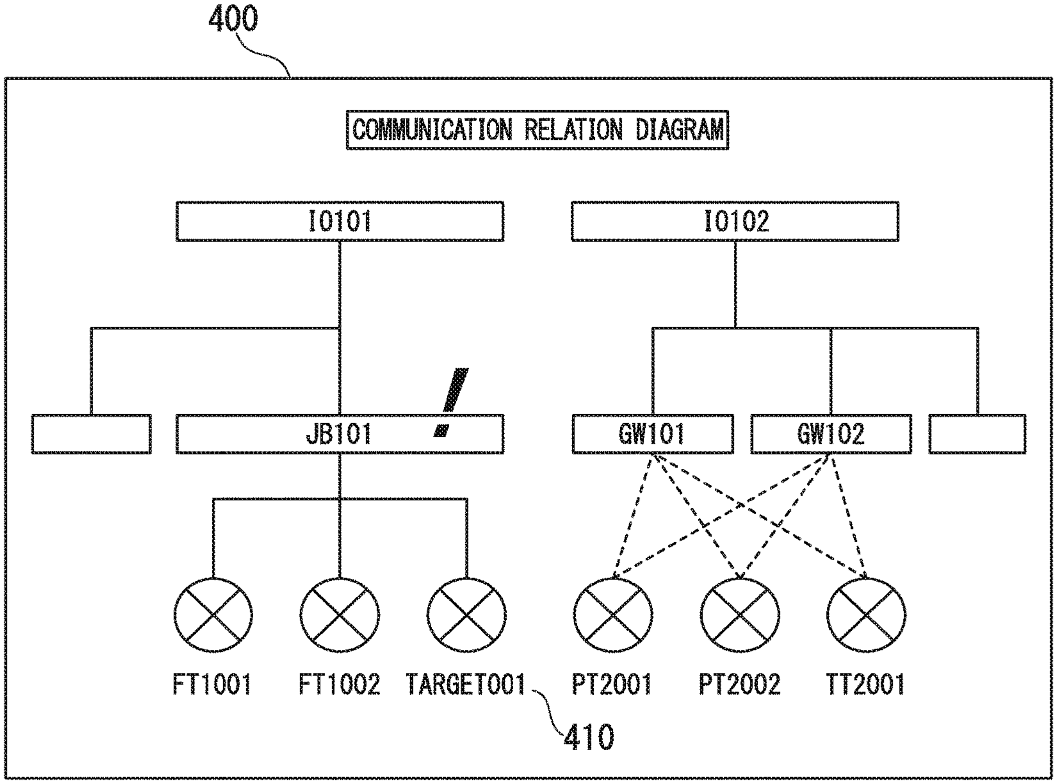
FIG. 8 is a drawing illustrating an example of control relation information stored in the storage.
FIG. 9 is a drawing illustrating an example of a communication relation diagram generated by the communication relation diagram generator.

FIG. 7 is a drawing illustrating an example of a control relation diagram generated by the control relation diagram generator. FIG. 8 is a drawing illustrating an example of control relation information stored in the storage. Hereinafter, generation processing of a control relation diagram 300 performed by the control relation diagram generator 31*c* will be described.

The control relation diagram generator 31*c* reads control relation information 320 shown in FIG. 8 out of the storage 34 by using the reader/writer 33. Information of a control logic (for example, a logic which performs PID control), information of a field device connected to an input end of the control logic, and information of a field device connected to an output end of the control logic are included in the control relation information 320.

As shown in FIG. 7, if the field device of TARGET001 is designated by the designator 11 as an attentional device 310, the control relation diagram generator 31*c* extracts a field device which has an input/output relation of control to the control logic to which TARGET001 is connected. Specifically, as shown in the reference sign 330 shown in FIG. 8, the control relation diagram generator 31*c* obtains information of the control logic (here, FIC100) to which TARGET001 is connected. As shown by the reference sign 340, the control relation diagram generator 31*c* searches a field device connected to the control logic FIC100. In the example of FIG. 8, the field device of FT1001 is extracted by the search.

Thereafter, the control relation diagram generator 31*c* reads a diagram, which shows an input/output relation of control of field devices in the plant, out of the storage 34 by using the reader/writer 33. As shown in FIG. 7, based on the read diagram, the control relation diagram generator 31*c* generates the control relation diagram 300 in which TARGET001 (attentional device) and a field device (relational device) which has the input/output relation of control to TARGET001 are included.

Figures 10, 11:
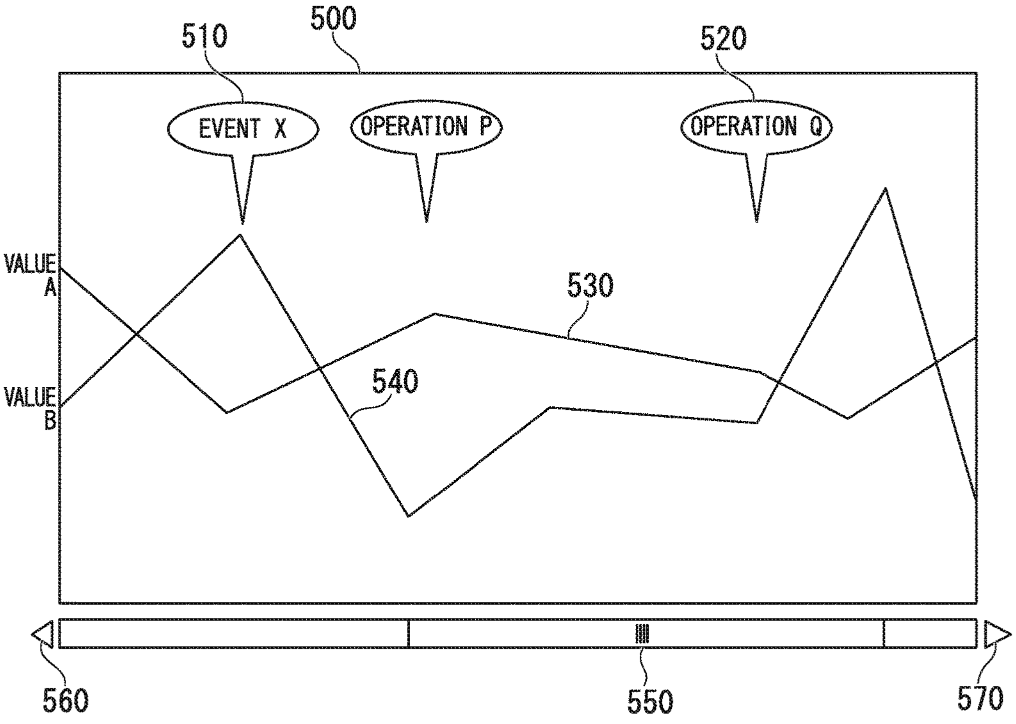
FIG. 10 is a drawing illustrating an example of communication relation information stored in the storage.
FIG. 11 is an example of a history diagram which shows a history of main measurement value of a field device, and a history of event which has been occurred in a field device.

FIG. 9 is a drawing illustrating an example of a communication relation diagram generated by the communication relation diagram generator. FIG. 10 is a drawing illustrating an example of communication relation information stored in the storage. Hereinafter, generation processing of a communication relation diagram 400 performed by the communication relation diagram generator 31*d* will be described.

The communication relation diagram generator 31*d* reads communication relation information 420 shown in FIG. 10 out of the storage 34 by using the reader/writer 33. Information of a device name and information of an upper node of each field device are included in the communication relation information 420.

As shown in FIG. 9, if the field device of TARGET001 is designated by the designator 11 as an attentional device 410, the communication relation diagram generator 31*d* extracts an upper node of TARGET001. Specifically, as shown in the reference sign 430 shown in FIG. 10, the communication relation diagram generator 31*d* obtains information of the upper node of TARGET001 (here, JB101). As shown by the reference sign 440, the communication relation diagram generator 31*d* searches a field device of which upper node is JB101. In the example of FIG. 10, the field device of FT1002 and the field device of FT1001 are extracted by the search.

Thereafter, the communication relation diagram generator 31*d* reads a diagram, which shows a connection relation of communication of field devices in the plant, out of the storage 34 by using the reader/writer 33. As shown in FIG. 9, based on the read diagram, the communication relation diagram generator 31*d* generates the communication relation diagram 400 in which TARGET001 (attentional device) and a field device (relational device) connected to TARGET001 through the upper node JB101 are included. In addition, a field device connected to the node 10101, which is further upper node of the upper node JB101, can also be used as the relational device.

FIG. 11 is an example of a history diagram which shows a history of main measurement value of a field device, and a history of event which has been occurred in a field device. Although details will be described later, a history diagram 500 is a diagram which is to be embedded into relation diagrams generated by generators 31*a* to 31*d*. In the history diagram 500, the horizontal axis shows time, and the vertical axis shows a magnitude of main measurement values A and B.

History information 510 and 520 of event and history information 530 and 540 of measurement value are included in the history diagram 500. The history information 510 of event represents timing when an event, such as an alarm generated by the field device, was generated. The history information 520 of event represents timing when an operation was performed to the field device. The history information 530 of measurement value represents a history of the main measurement value A. The history information 540 of measurement value represents a history of the main measurement value B. In addition, event information which currently occurs and continues may be displayed.

A scroll bar 550, a left scroll key 560, and a right scroll key 570 are arranged under the history diagram 500. The plant worker W can scroll the history diagram 500 in a horizontal direction by moving the scroll bar 550 rightward or leftward. The plant worker W can scroll the history diagram 500 leftward by using the left scroll key 560, and can scroll the history diagram 500 rightward by using the right scroll key 570.

Next, a positional relation diagram 600, a process relation diagram 700, a control relation diagram 800, and a communication relation diagram 900, which are displayed on the display 12 of the terminal device 10, will be described. A current value of the main measurement value and a history diagram are embedded in these diagrams.

Figure 12:
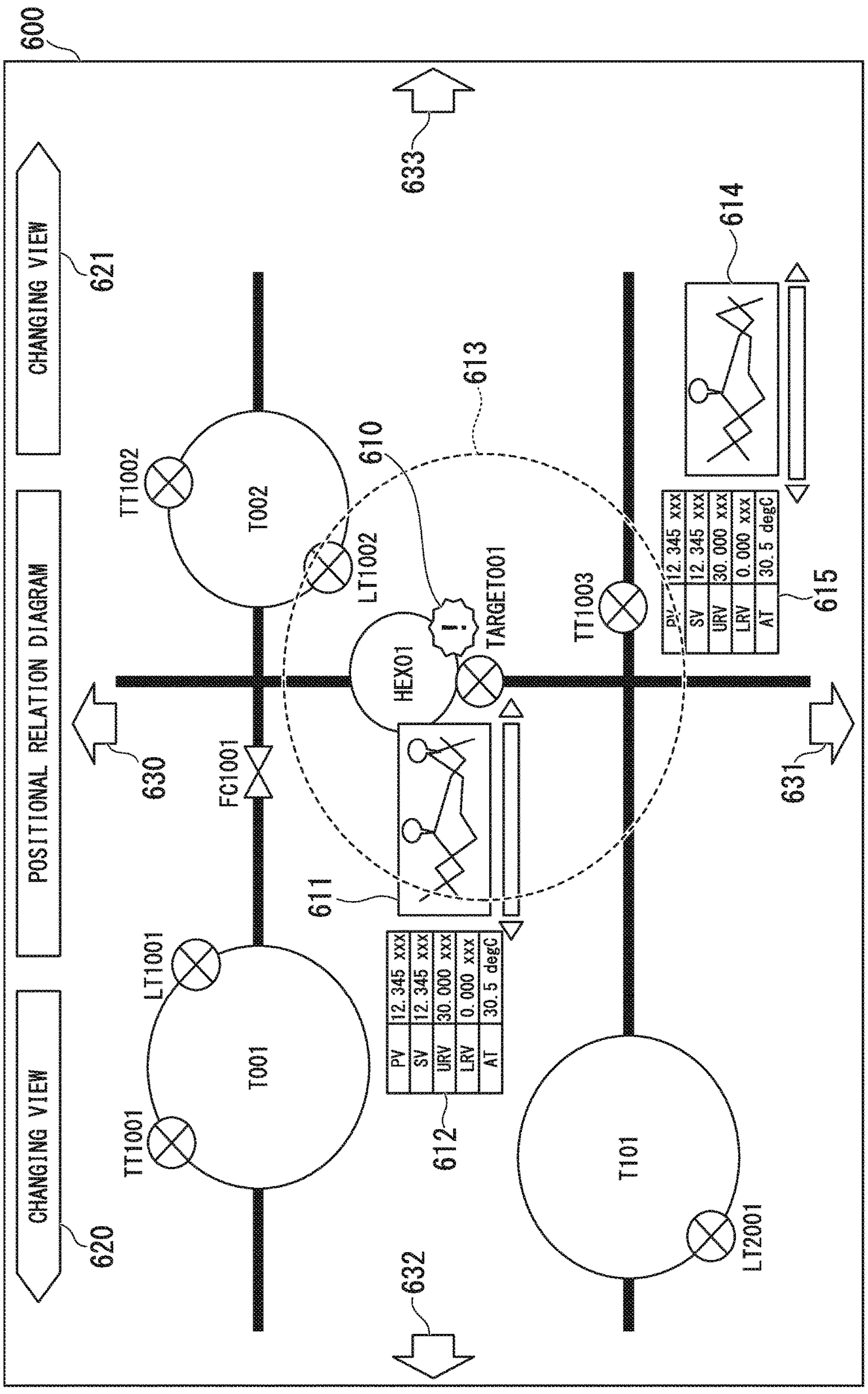
FIG. 12 is a drawing illustrating the positional relation diagram in which the current value of the main measurement value and the history diagram are embedded.

FIG. 12 is a drawing illustrating the positional relation diagram in which the current value of the main measurement value and the history diagram are embedded. As shown in FIG. 12, an exclamation mark 610 is shown at TARGET001 in the positional relation diagram 600 so that it can be understood that TARGET001 is an attentional device. The exclamation mark 610 is an example, and another mark for showing an attentional point may be displayed.

The history diagram 611 of TARGET001 and the current value 612 of the main measurement value are shown at a position adjacent to TARGET001. Thereby, since the plant worker W can understand the various history information of the attentional device TARGET001 and the current value of the main measurement value, the plant worker W can easily specify a factor of the abnormality.

The dashed line 613 represents an indication of a range within a predetermined distance from TARGET001. The worker W can set a value of the predetermined distance beforehand by using the terminal device 10. Whether or not a field device is located in the range within the predetermined distance from TARGET001 is determined by using the positional relation information 120 shown in FIG. 4. As shown in FIG. 12, a relational device TT1003 exists within the range of the dashed line 613. The history diagram 614 of TT1003 and the current value 615 of the main measurement value are shown at a position adjacent to the relational device TT1003. Thereby, since the plant worker W can understand the various history information of the relational device TT1003 and the current value of the main measurement value, the plant worker W can easily specify a factor of the abnormality.

A view change keys 620 and 621 are arranged at the top of the positional relation diagram 600. If the worker W selects the view change key 620, the screen of the display 12 is changed to a communication relation diagram 900 (FIG. 21) which will be described later. On the other hand, if the worker W selects the view change key 621, the screen of the display 12 is changed to a process relation diagram 700 (FIG. 15) which will be described later.

An upper scroll key 630, a lower scroll key 631, a left scroll key 632, and a right scroll key 633 are arranged in the positional relation diagram 600. If the worker W selects the upper scroll key 630, the positional relation diagram 600 is scrolled upward. If the worker W selects the lower scroll key 631, the positional relation diagram 600 is scrolled downward. If the worker W selects the left scroll key 632, the positional relation diagram 600 is scrolled leftward. If the worker W selects the right scroll key 633, the positional relation diagram 600 is scrolled rightward. The worker W may swipe a finger over the positional relation diagram 600 in order to scroll the positional relation diagram 600.

Next, an embedment processing of the measurement value history performed by the measurement value history embedder 32*a*, an embedment processing of the event history performed by the event history embedder 32*b*, and an embedment processing of the current value of the main measurement value performed by the current value embedder 32*c* will be described.

The controller 40 shown in FIG. 1 collects main measurement values of the field devices 50 and 60 through the field network from the field devices 50 and 60. The controller 40 transmits the collected main measurement values to the information processor 30. The information processor 30 stores the main measurement values received from the controller 40 into the storage 34, and the information processor 30 generates main measurement value history information.

The controller 40 collects event information, which has been occurred in the field devices 50 and 60, through the field network from the field devices 50 and 60. The controller 40 transmits the collected event information to the information processor 30. The information processor 30 stored the event information received from the controller 40 into the storage 34, and the information processor 30 generates event history information.

FIG. 13 is a drawing illustrating an example of the main measurement value history information stored in the storage. As shown in FIG. 13, information of a device name, information of date and time, information of a data name, and a data value are included in the main measurement value history information 640. The reader/writer 33 reads the main measurement value history information 640 out of the storage 34.

As shown in the reference sign 650 of FIG. 13, the measurement value history embedder 32*a* obtains the history information (the information of date and time, the information of the data name, and the data value) of the main measurement value of the attentional device TARGET001 from the main measurement value history information 640. As shown in the reference sign 660 of FIG. 13, the measurement value history embedder 32*a* obtains the history information (the information of date and time, the information of the data name, and the data value) of the main measurement value of the relational device TT1003 from the main measurement value history information 640.

FIG. 14 is a drawing illustrating an example of the event history information stored in the storage. As shown in FIG. 14, information of a device name, information of date and time, and information of an event are included in the event history information 670. The reader/writer 33 reads the event history information 670 out of the storage 34.

As shown in the reference signs 680 and 681 of FIG. 14, the event history embedder 32*b* obtains the history information (the information of date and time, and the information of the event) of the event, which has occurred in the attentional device TARGET001, from the event history information 670. As shown in the reference sign 690 of FIG. 14, the event history embedder 32*b* obtains the history information (the information of date and time, and the information of the event) of the event, which has occurred in the relational device TT1003, from the event history information 670.

As shown in FIG. 12, the measurement value history embedder 32*a* embeds, into the positional relation diagram 600, the history information of the main measurement value of the attentional device TARGET001. Moreover, the event history embedder 32*b* embeds, into the positional relation diagram 600, the history information of the event which has occurred in the attentional device TARGET001. Thereby, the history diagram 611 of TARGET001 is embedded in the positional relation diagram 600.

The current value embedder 32*c* obtains a newest value of the main measurement value of the attentional device TARGET001 from the main measurement value history information 640. Thereafter, the current value embedder 32*c* embeds, into the positional relation diagram 600, the obtained newest value as the current value 612 of the main measurement value.

On the other hand, the measurement value history embedder 32*a* embeds, into the positional relation diagram 600, the history information of the main measurement value of the relational device TT1003. Moreover, the event history embedder 32*b* embeds, into the positional relation diagram 600, the history information of the event which has occurred in the relational device TT1003. Thereby, the history diagram 614 of TT1003 is embedded in the positional relation diagram 600.

The current value embedder 32*c* obtains a newest value of the main measurement value of the relational device TT1003 from the main measurement value history information 640. Thereafter, the current value embedder 32*c* embeds, into the positional relation diagram 600, the obtained newest value as the current value 615 of the main measurement value. By the above-described processing, the positional relation diagram 600 in which the current value of the main measurement value and the history diagram have been embedded is generated.

Figure 15:
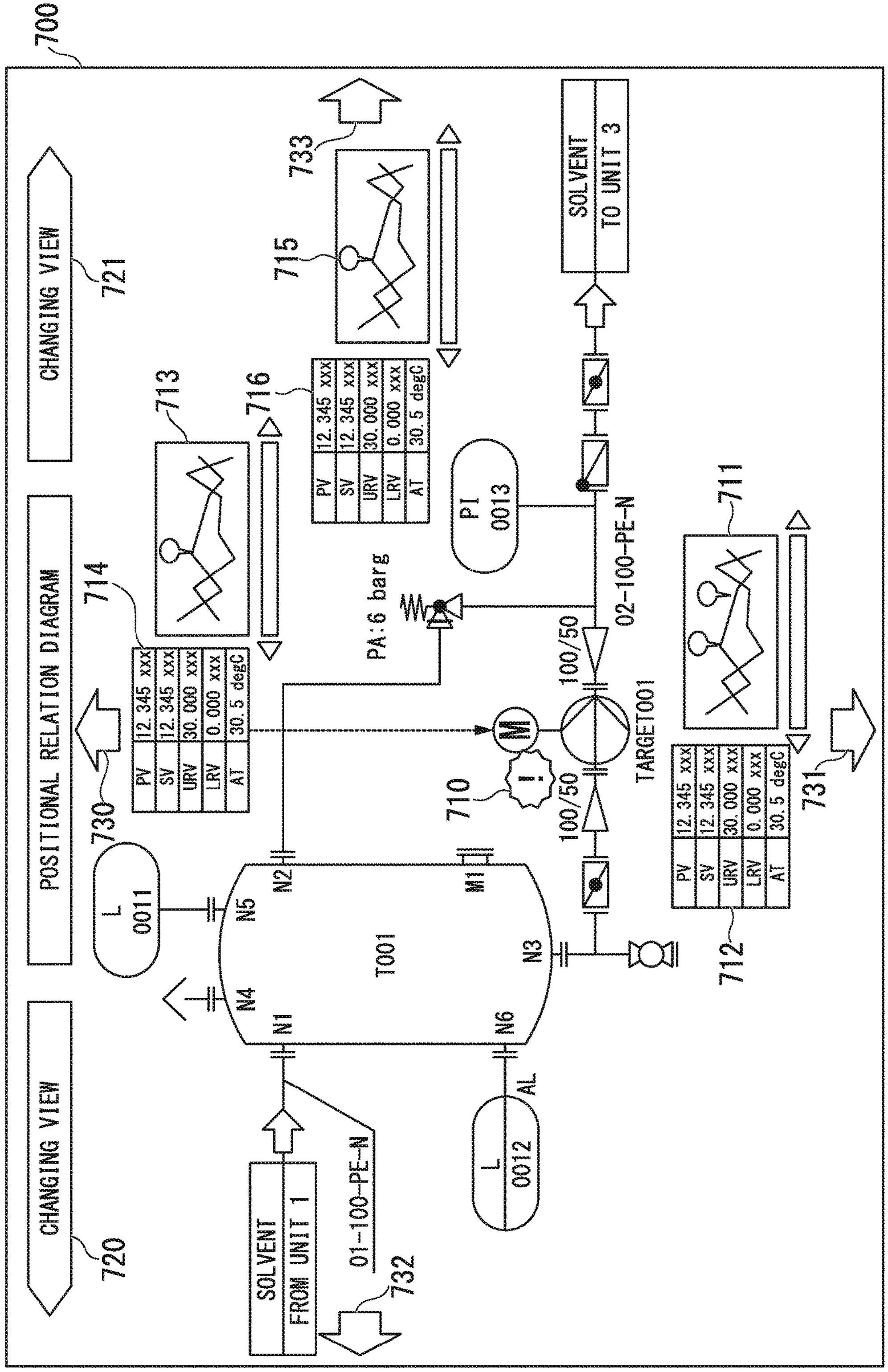
FIG. 15 is a drawing illustrating the process relation diagram in which the current value of the main measurement value and the history diagram are embedded.

FIG. 15 is a drawing illustrating the process relation diagram in which the current value of the main measurement value and the history diagram are embedded. As shown in FIG. 15, an exclamation mark 710 is shown at TARGET001 in the process relation diagram 700 so that it can be understood that TARGET001 is an attentional device. The exclamation mark 710 is an example, and another mark for showing an attentional point may be displayed.

The history diagram 711 of TARGET001 and the current value 712 of the main measurement value are shown at a position adjacent to TARGET001. Thereby, since the plant worker W can understand the various history information of the attentional device TARGET001 and the current value of the main measurement value, the plant worker W can easily specify a factor of the abnormality.

The history diagram 713 of L0011 and the current value 714 of the main measurement value are shown at a position adjacent to the relational device L0011. Thereby, since the plant worker W can understand the various history information of the relational device L0011 and the current value of the main measurement value, the plant worker W can easily specify a factor of the abnormality.

The history diagram 715 of PI0013 and the current value 716 of the main measurement value are shown at a position adjacent to the relational device PI0013. Thereby, since the plant worker W can understand the various history information of the relational device PI0013 and the current value of the main measurement value, the plant worker W can easily specify a factor of the abnormality.

A view change keys 720 and 721 are arranged at the top of the process relation diagram 700. If the worker W selects the view change key 720, the screen of the display 12 is changed to the positional relation diagram 600 (FIG. 12). On the other hand, if the worker W selects the view change key 721, the screen of the display 12 is changed to a control relation diagram 800 (FIG. 18) which will be described later.

An upper scroll key 730, a lower scroll key 731, a left scroll key 732, and a right scroll key 733 are arranged in the process relation diagram 700. If the worker W selects the upper scroll key 730, the process relation diagram 700 is scrolled upward. If the worker W selects the lower scroll key 731, the process relation diagram 700 is scrolled downward. If the worker W selects the left scroll key 732, the process relation diagram 700 is scrolled leftward. If the worker W selects the right scroll key 733, the process relation diagram 700 is scrolled rightward. The worker W may swipe a finger over the process relation diagram 700 in order to scroll the process relation diagram 700.

Next, an embedment processing of the measurement value history performed by the measurement value history embedder 32*a*, an embedment processing of the event history performed by the event history embedder 32*b*, and an embedment processing of the current value of the main measurement value performed by the current value embedder 32*c* will be described.

FIG. 16 is a drawing illustrating an example of the main measurement value history information stored in the storage. As shown in FIG. 16, information of a device name, information of date and time, information of a data name, and a data value are included in the main measurement value history information 740. The reader/writer 33 reads the main measurement value history information 740 out of the storage 34.

As shown in the reference sign 750 of FIG. 16, the measurement value history embedder 32*a* obtains the history information (the information of date and time, the information of the data name, and the data value) of the main measurement value of the attentional device TARGET001 from the main measurement value history information 740. As shown in the reference sign 760 of FIG. 16, the measurement value history embedder 32*a* obtains the history information (the information of date and time, the information of the data name, and the data value) of the main measurement value of the relational device L0011 from the main measurement value history information 740. Furthermore, as shown in the reference sign 761 of FIG. 16, the measurement value history embedder 32$a$ obtains the history information (the information of date and time, the information of the data name, and the data value) of the main measurement value of the relational device PI0013 from the main measurement value history information 740.

FIG. 17 is a drawing illustrating an example of the event history information stored in the storage. As shown in FIG. 17, information of a device name, information of date and time, and information of an event are included in the event history information 770. The reader/writer 33 reads the event history information 770 out of the storage 34.

As shown in the reference signs 780 and 781 of FIG. 17, the event history embedder 32$b$ obtains the history information (the information of date and time, and the information of the event) of the event, which has occurred in the attentional device TARGET001, from the event history information 770. As shown in the reference sign 790 of FIG. 17, the event history embedder 32$b$ obtains the history information (the information of date and time, and the information of the event) of the event, which has occurred in the relational device L0011, from the event history information 770. Furthermore, as shown in the reference sign 791 of FIG. 17, the event history embedder 32$b$ obtains the history information (the information of date and time, and the information of the event) of the event, which has occurred in the relational device P10013, from the event history information 770.

As shown in FIG. 15, the measurement value history embedder 32$a$ embeds, into the process relation diagram 700, the history information of the main measurement value of the attentional device TARGET001. Moreover, the event history embedder 32$b$ embeds, into the process relation diagram 700, the history information of the event which has occurred in the attentional device TARGET001. Thereby, the history diagram 711 of TARGET001 is embedded in the process relation diagram 700.

The current value embedder 32$c$ obtains a newest value of the main measurement value of the attentional device TARGET001 from the main measurement value history information 740. Thereafter, the current value embedder 32$c$ embeds, into the process relation diagram 700, the obtained newest value as the current value 712 of the main measurement value.

On the other hand, the measurement value history embedder 32$a$ embeds, into the process relation diagram 700, the history information of the main measurement value of the relational device L0011. Moreover, the event history embedder 32$b$ embeds, into the process relation diagram 700, the history information of the event which has occurred in the relational device L0011. Thereby, the history diagram 713 of L0011 is embedded in the process relation diagram 700.

The current value embedder 32$c$ obtains a newest value of the main measurement value of the relational device L0011 from the main measurement value history information 740. Thereafter, the current value embedder 32$c$ embeds, into the process relation diagram 700, the obtained newest value as the current value 714 of the main measurement value.

On the other hand, the measurement value history embedder 32$a$ embeds, into the process relation diagram 700, the history information of the main measurement value of the relational device PI0013. Moreover, the event history embedder 32$b$ embeds, into the process relation diagram 700, the history information of the event which has occurred in the relational device PI0013. Thereby, the history diagram 715 of PI0013 is embedded in the process relation diagram 700.

The current value embedder 32$c$ obtains a newest value of the main measurement value of the relational device PI0013 from the main measurement value history information 740. Thereafter, the current value embedder 32$c$ embeds, into the process relation diagram 700, the obtained newest value as the current value 716 of the main measurement value. By the above-described processing, the process relation diagram 700 in which the current value of the main measurement value and the history diagram have been embedded is generated.

Figure 18:
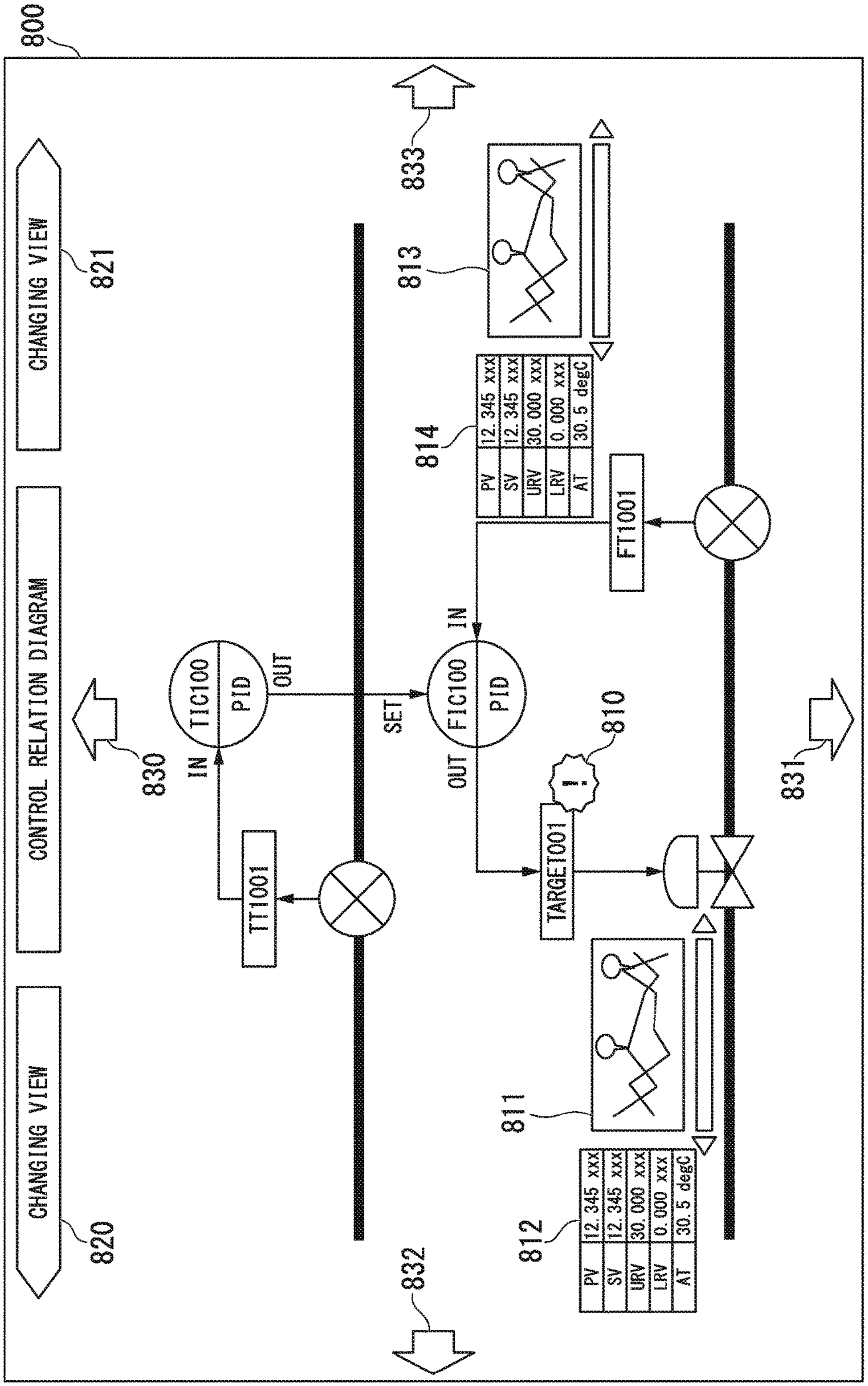
FIG. 18 is a drawing illustrating the control relation diagram in which the current value of the main measurement value and the history diagram are embedded.

FIG. 18 is a drawing illustrating the control relation diagram in which the current value of the main measurement value and the history diagram are embedded. As shown in FIG. 18, an exclamation mark 810 is shown at TARGET001 in the control relation diagram 800 so that it can be understood that TARGET001 is an attentional device. The exclamation mark 810 is an example, and another mark for showing an attentional point may be displayed.

The history diagram 811 of TARGET001 and the current value 812 of the main measurement value are shown at a position adjacent to TARGET001. Thereby, since the plant worker W can understand the various history information of the attentional device TARGET001 and the current value of the main measurement value, the plant worker W can easily specify a factor of the abnormality.

The history diagram 813 of FT1001 and the current value 814 of the main measurement value are shown at a position adjacent to the relational device FT1001. Thereby, since the plant worker W can understand the various history information of the relational device FT1001 and the current value of the main measurement value, the plant worker W can easily specify a factor of the abnormality.

A view change keys 820 and 821 are arranged at the top of the control relation diagram 800. If the worker W selects the view change key 820, the screen of the display 12 is changed to the process relation diagram 700 (FIG. 15). On the other hand, if the worker W selects the view change key 821, the screen of the display 12 is changed to a communication relation diagram 900 (FIG. 21) which will be described later.

An upper scroll key 830, a lower scroll key 831, a left scroll key 832, and a right scroll key 833 are arranged in the control relation diagram 800. If the worker W selects the upper scroll key 830, the control relation diagram 800 is scrolled upward. If the worker W selects the lower scroll key 831, the control relation diagram 800 is scrolled downward. If the worker W selects the left scroll key 832, the control relation diagram 800 is scrolled leftward. If the worker W selects the right scroll key 833, the control relation diagram 800 is scrolled rightward. The worker W may swipe a finger over the control relation diagram 800 in order to scroll the control relation diagram 800.

Next, an embedment processing of the measurement value history performed by the measurement value history embedder 32$a$, an embedment processing of the event history performed by the event history embedder 32$b$, and an embedment processing of the current value of the main measurement value performed by the current value embedder 32$c$ will be described.

FIG. 19 is a drawing illustrating an example of the main measurement value history information stored in the storage. As shown in FIG. 19, information of a device name, information of date and time, information of a data name, and a data value are included in the main measurement value history information 840. The reader/writer 33 reads the main measurement value history information 840 out of the storage 34.

As shown in the reference sign 850 of FIG. 19, the measurement value history embedder 32*a* obtains the history information (the information of date and time, the information of the data name, and the data value) of the main measurement value of the attentional device TARGET001 from the main measurement value history information 840. As shown in the reference sign 860 of FIG. 19, the measurement value history embedder 32*a* obtains the history information (the information of date and time, the information of the data name, and the data value) of the main measurement value of the relational device FT1001 from the main measurement value history information 840.

FIG. 20 is a drawing illustrating an example of the event history information stored in the storage. As shown in FIG. 20, information of a device name, information of date and time, and information of an event are included in the event history information 870. The reader/writer 33 reads the event history information 870 out of the storage 34.

As shown in the reference sign 880 of FIG. 20, the event history embedder 32*b* obtains the history information (the information of date and time, and the information of the event) of the event, which has occurred in the attentional device TARGET001, from the event history information 870. As shown in the reference sign 890 of FIG. 20, the event history embedder 32*b* obtains the history information (the information of date and time, and the information of the event) of the event, which has occurred in the relational device FT1001, from the event history information 870.

As shown in FIG. 18, the measurement value history embedder 32*a* embeds, into the control relation diagram 800, the history information of the main measurement value of the attentional device TARGET001. Moreover, the event history embedder 32*b* embeds, into the control relation diagram 800, the history information of the event which has occurred in the attentional device TARGET001. Thereby, the history diagram 811 of TARGET001 is embedded in the control relation diagram 800.

The current value embedder 32*c* obtains a newest value of the main measurement value of the attentional device TARGET001 from the main measurement value history information 840. Thereafter, the current value embedder 32*c* embeds, into the control relation diagram 800, the obtained newest value as the current value 812 of the main measurement value.

On the other hand, the measurement value history embedder 32*a* embeds, into the control relation diagram 800, the history information of the main measurement value of the relational device FT1001. Moreover, the event history embedder 32*b* embeds, into the control relation diagram 800, the history information of the event which has occurred in the relational device FT1001. Thereby, the history diagram 813 of FT1001 is embedded in the control relation diagram 800.

The current value embedder 32*c* obtains a newest value of the main measurement value of the relational device FT1001 from the main measurement value history information 840. Thereafter, the current value embedder 32*c* embeds, into the control relation diagram 800, the obtained newest value as the current value 814 of the main measurement value. By the above-described processing, the control relation diagram 800 in which the current value of the main measurement value and the history diagram have been embedded is generated.

Figure 21:
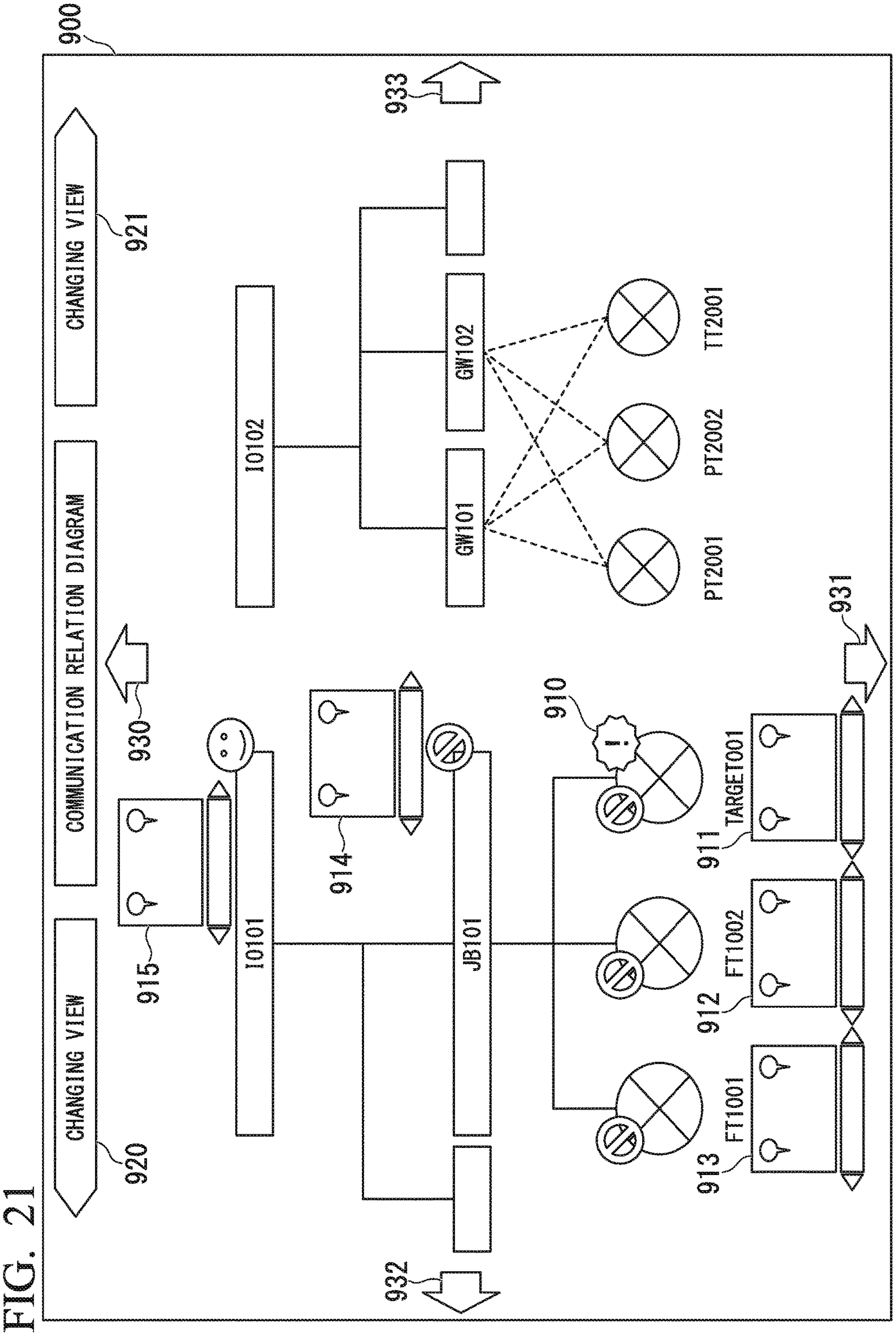
FIG. 21 is a drawing illustrating the communication relation diagram in which the history diagram is embedded.

FIG. 21 is a drawing illustrating the communication relation diagram in which the history diagram is embedded. As shown in FIG. 21, an exclamation mark 910 is shown at TARGET001 in the communication relation diagram 900 so that it can be understood that TARGET001 is an attentional device. The exclamation mark 910 is an example, and another mark for showing an attentional point may be displayed.

The history diagram 911 of TARGET001 is shown at a position adjacent to TARGET001. Thereby, since the plant worker W can understand the history information of the event (for example, alarm) which has occurred in the attentional device TARGET001, the plant worker W can easily specify a factor of the abnormality.

The history diagram 912 of FT1002 is shown at a position adjacent to the relational device FT1002. Thereby, since the plant worker W can understand the history information of the event (for example, alarm) which has occurred in the relational device FT1002, the plant worker W can easily specify a factor of the abnormality.

The history diagram 913 of FT1001 is shown at a position adjacent to the relational device FT1001. Thereby, since the plant worker W can understand the history information of the event (for example, alarm) which has occurred in the relational device FT1001, the plant worker W can easily specify a factor of the abnormality.

A view change keys 920 and 921 are arranged at the top of the communication relation diagram 900. If the worker W selects the view change key 920, the screen of the display 12 is changed to the control relation diagram 800 (FIG. 18). On the other hand, if the worker W selects the view change key 921, the screen of the display 12 is changed to the positional relation diagram 600 (FIG. 12).

An upper scroll key 930, a lower scroll key 931, a left scroll key 932, and a right scroll key 933 are arranged in the communication relation diagram 900. If the worker W selects the upper scroll key 930, the communication relation diagram 900 is scrolled upward. If the worker W selects the lower scroll key 931, the communication relation diagram 900 is scrolled downward. If the worker W selects the left scroll key 932, the communication relation diagram 900 is scrolled leftward. If the worker W selects the right scroll key 933, the communication relation diagram 900 is scrolled rightward. The worker W may swipe a finger over the communication relation diagram 900 in order to scroll the communication relation diagram 900.

Figures 22, 23:
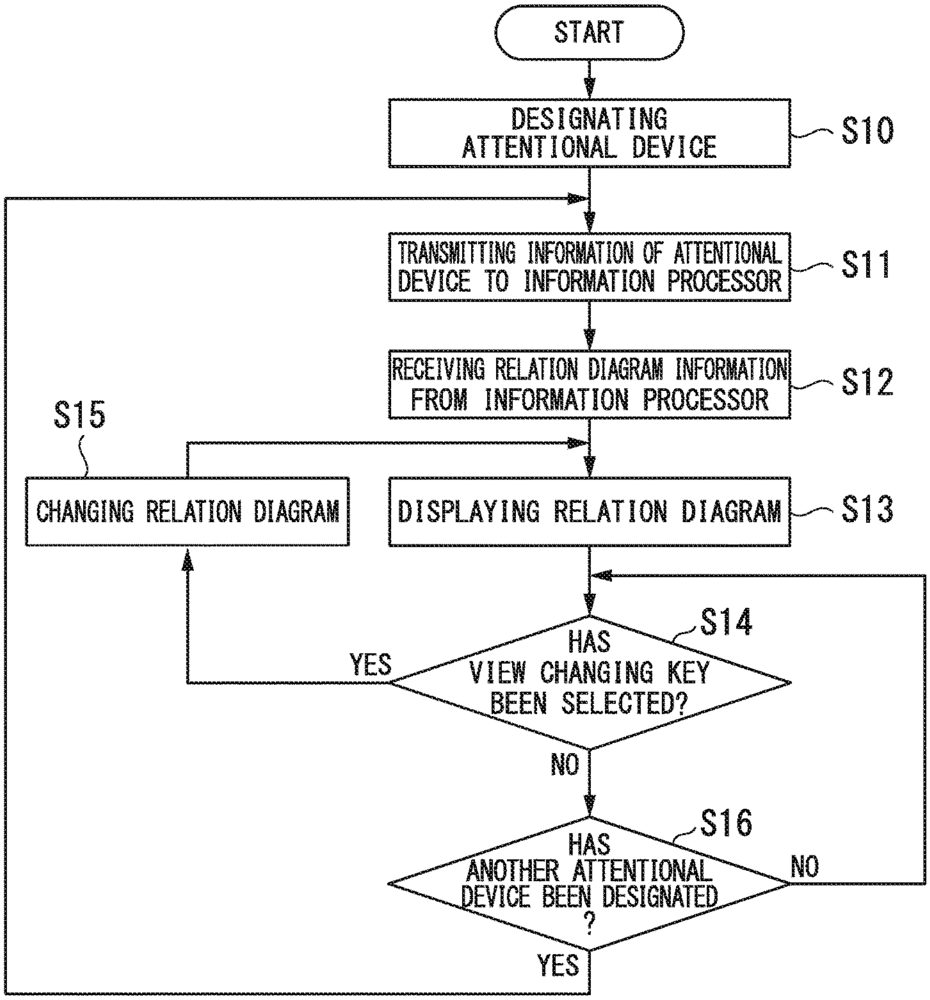
FIG. 22 is a drawing illustrating an example of the event history information stored in the storage.
FIG. 23 is a flow chart illustrating a display processing performed by the terminal device.

Next, an embedment processing of the event history performed by the event history embedder 32*b* will be described. FIG. 22 is a drawing illustrating an example of the event history information stored in the storage. As shown in FIG. 22, information of a device name, information of date and time, and information of an event are included in the event history information 940. The reader/writer 33 reads the event history information 940 out of the storage 34.

As shown in the reference sign 950 of FIG. 22, the event history embedder 32*b* obtains the history information (the information of date and time, and the information of the event) of the event, which has occurred in the attentional device TARGET001, from the event history information 940. As shown in the reference sign 960 of FIG. 22, the event history embedder 32*b* obtains the history information (the information of date and time, and the information of the event) of the event, which has occurred in the relational devices FT1001 and FT1002, from the event history information 940.

As shown in FIG. 21, the event history embedder 32*b* embeds, into the communication relation diagram 900, the history information of the event which has occurred in the attentional device TARGET001. Thereby, the history diagram 911 of TARGET001 is embedded in the communication relation diagram 900.

The event history embedder 32*b* embeds, into the communication relation diagram 900, the history information of the event which has occurred in the relational device FT1002. Thereby, the history diagram 912 of FT1002 is embedded in the communication relation diagram 900.

The event history embedder 32*b* embeds, into the communication relation diagram 900, the history information of the event which has occurred in the relational device FT1001. Thereby, the history diagram 913 of FT1001 is embedded in the communication relation diagram 900. By the above-described processing, the communication relation diagram 900 in which the history diagram has been embedded is generated. In addition, an embedment processing of the measurement value history and an embedment processing of the current value may also be performed with respect to the communication relation diagram 900.

In FIGS. 12, 15, 18, and 21, if many current values and histories of the field devices are displayed, the display contents may be complicated depending on a size of the display 12. In this case, the worker W can erase a current value or a history by designating a field device on the screen. Moreover, if necessary, the worker W can also re-display the erased contents by designating a field device on the screen.

FIG. 23 is a flow chart illustrating a display processing performed by the terminal device. The plant worker W designates an attentional device from the screen displayed on the display 12. The attentional device is designated by using the designator 11 which is configured by a touchpad (Step S10). If the attentional device is designated, the transmitter 13*a* transmits information of the attentional device (device name: TARGET001) to the information processor 30 (Step S11).

On the other hand, the information processor 30 creates relation diagram information based on the information of the attentional device received from the terminal device 10. The relation diagram information is information which represents four relation diagrams (the positional relation diagram 600 (FIG. 12), the process relation diagram 700 (FIG. 15), the control relation diagram 800 (FIG. 18), and the communication relation diagram 900 (FIG. 21)).

Thereafter, the receiver 13*b* receives the relation diagram information from the information processor 30 (Step S12). The display 12 displays one relation diagram (for example, the positional relation diagram 600 (FIG. 12)) of the four relation diagrams based on the received relation diagram information (Step S13).

If a view change key has been selected on the relation diagram displayed on the display 12 (Step S14: YES), the display 12 changes the relation diagram in accordance with the selected view change key (Step S15). Thereafter, returning to Step S13, and the display 12 displays the changed relation diagram.

On the other hand, if the view change key has not been selected on the relation diagram displayed on the display 12 (Step S14: NO), progressing to Step S16. If another attentional device which is different from the currently designated attentional device has been designated on the relation diagram displayed on the display 12 (Step S16: YES), returning to Step S11, and the transmitter 13*a* transmits the information of the designated other attentional device to the information processor 30. If the information processor 30 has received the information of the other attentional device, the information processor 30 re-generates a relation diagram based on the received information of the other attentional device. On the other hand, if the other attentional device has not been designated on the relation diagram displayed on the display 12 (Step S16: NO), returning to Step S14.

The program for executing the flow chart shown in FIG. 23 may be stored in non-transitory storage medium, such as a CD-ROM. If this storage medium is used, for example, the program can be installed in the terminal device 10.

Figure 24:
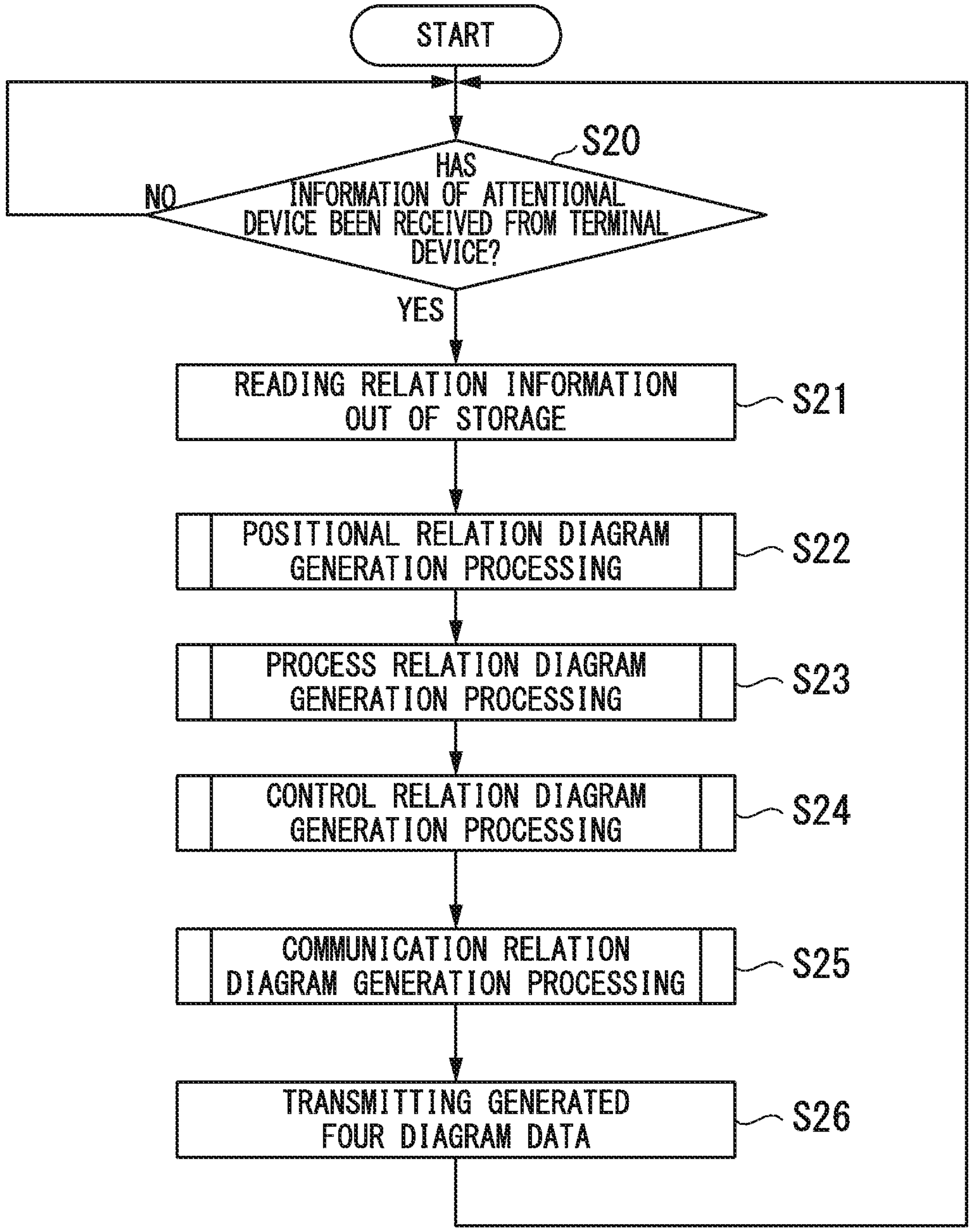
FIG. 24 is a flow chart illustrating a generation processing of a relation diagram performed by the information processor.

FIG. 24 is a flow chart illustrating a generation processing of a relation diagram performed by the information processor. In Step S11 of FIG. 23, if the transmitter 13*a* of the terminal device 10 transmits the information of the attentional device, the receiver 35*b* of the information processor 30 receives the information of the attentional device (Step S20: YES). Thereafter, the reader/writer 33 reads, out of the storage 34, the relation information (the positional relation information 120 (FIG. 4), the process relation information 220 (FIG. 6), the control relation information 320 (FIG. 8), and the communication relation information 420 (FIG. 10)) (Step S21).

Next, the positional relation diagram generator 31*a* performs a positional relation diagram generation processing (Step S22), the process relation diagram generator 31*b* performs a process relation diagram generation processing (Step S23), the control relation diagram generator 31*c* performs a control relation diagram generation processing (Step S24), and the communication relation diagram generator 31*d* performs a communication relation diagram generation processing (Step S25). Details of these generation processing will be described later.

Thereafter, the transmitter 35*a* transmits the generated four diagram data (the positional relation diagram, the process relation diagram, the control relation diagram, and the communication relation diagram) to the terminal device 10 (Step S26), and returning to Step S20. The four diagram data transmitted by the transmitter 35*a* are received by the receiver 13*b* of the terminal device 10 in Step S12 of FIG. 23.

Figure 25:
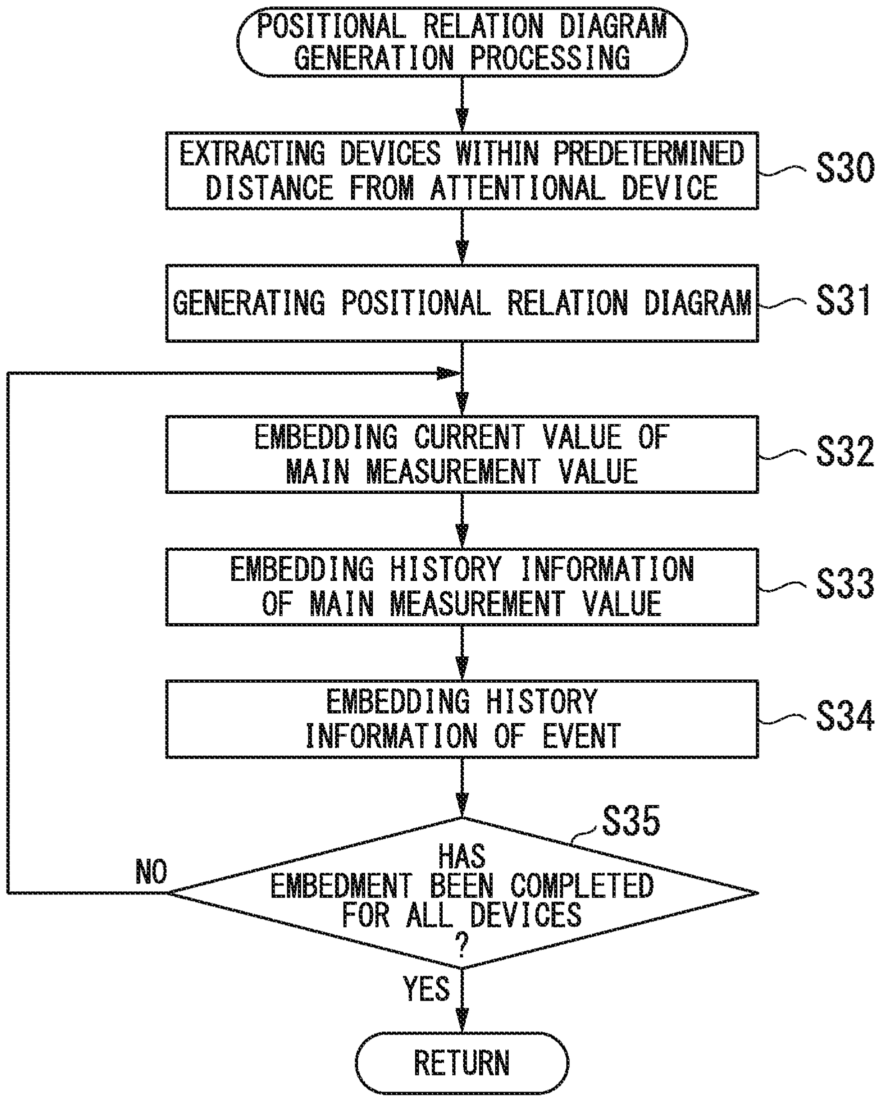
FIG. 25 is a flow chart illustrating a generation processing of the positional relation diagram performed by the information processor.

FIG. 25 is a flow chart illustrating a generation processing of the positional relation diagram performed by the information processor. FIG. 25 is a drawing illustrating the positional relation diagram generation processing of Step S22 of FIG. 24 in detail. As shown in FIG. 4, the positional relation diagram generator 31*a* extracts, as a relational device, field devices within a predetermined distance from the attentional device (Step S30). Thereafter, the positional relation diagram generator 31*a* generates the positional relation diagram 100 shown in FIG. 3 (Step S31).

Next, the current value embedder 32*c* embeds the current value of the main measurement value (Step S32). The measurement value history embedder 32*a* embeds the history information of the main measurement value (Step S33). The event history embedder 32*b* embeds the history information of the event (Step S34).

Thereafter, if the embedment has not been completed for all the extracted field devices (the attentional device and the relational device) (Step S35: NO), returning to Step S32, and an embedment processing for the other device is to be performed. On the other hand, if the embedment has been completed for all the extracted field devices (the attentional device and the relational device) (Step S35: YES), processing of this flow chart is ended. As shown in FIG. 12, by the above-described processing, the positional relation diagram 600 in which the current value of the main measurement value and the history diagram have been embedded is generated.

Figure 26:
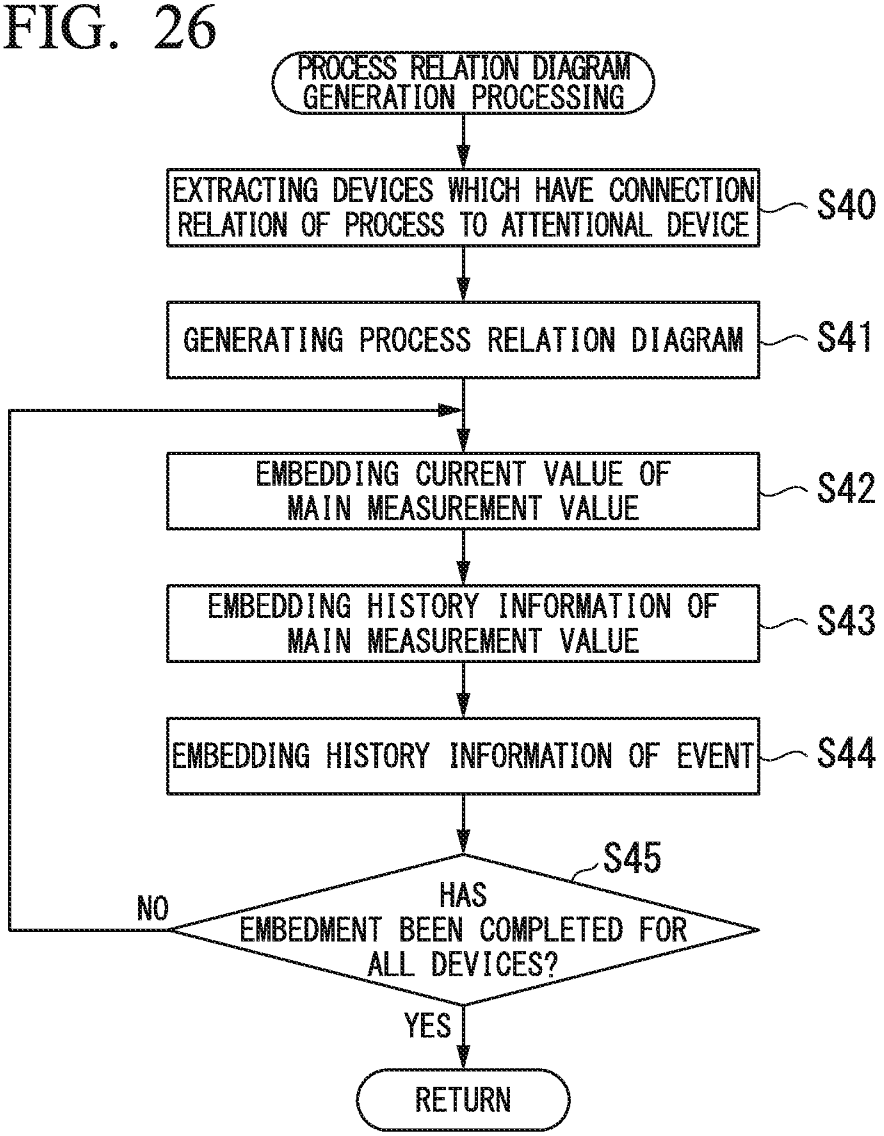
FIG. 26 is a flow chart illustrating a generation processing of a process relation diagram performed by the information processor.

FIG. 26 is a flow chart illustrating a generation processing of a process relation diagram performed by the information processor. FIG. 26 is a drawing illustrating the process relation diagram generation processing of Step S23 of FIG. 24 in detail. As shown in FIG. 6, the process relation diagram generator 31*b* extracts, as a relational device, field devices which have connection relation of process to the attentional device (Step S40). Thereafter, the process relation diagram generator 31*b* generates the process relation diagram 200 shown in FIG. 5 (Step S41).

Next, the current value embedder 32*c* embeds the current value of the main measurement value (Step S42). The measurement value history embedder 32*a* embeds the history information of the main measurement value (Step S43). The event history embedder 32*b* embeds the history information of the event (Step S44).

Thereafter, if the embedment has not been completed for all the extracted field devices (the attentional device and the relational device) (Step S45: NO), returning to Step S42, and an embedment processing for the other device is to be performed. On the other hand, if the embedment has been completed for all the extracted field devices (the attentional device and the relational device) (Step S45: YES), processing of this flow chart is ended. As shown in FIG. 15, by the above-described processing, the process relation diagram 700 in which the current value of the main measurement value and the history diagram have been embedded is generated.

Figure 27:
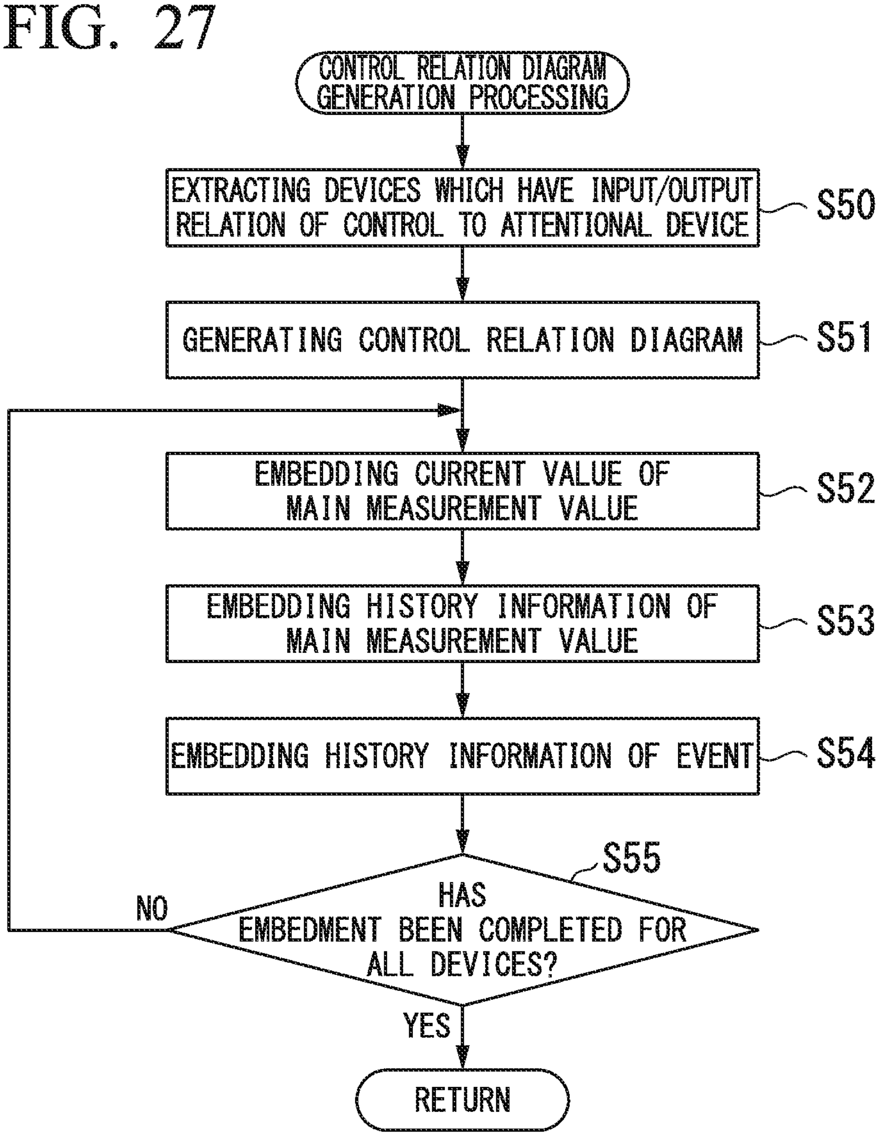
FIG. 27 is a flow chart illustrating a generation processing of a control relation diagram performed by the information processor.

FIG. 27 is a flow chart illustrating a generation processing of a control relation diagram performed by the information processor. FIG. 27 is a drawing illustrating the control relation diagram generation processing of Step S24 of FIG. 24 in detail. As shown in FIG. 8, the control relation diagram generator 31*c* extracts, as a relational device, field devices which have input/output relation of control to the attentional device (Step S50). Thereafter, the control relation diagram generator 31*c* generates the control relation diagram 300 shown in FIG. 7 (Step S51).

Next, the current value embedder 32*c* embeds the current value of the main measurement value (Step S52). The measurement value history embedder 32*a* embeds the history information of the main measurement value (Step S53). The event history embedder 32*b* embeds the history information of the event (Step S54).

Thereafter, if the embedment has not been completed for all the extracted field devices (the attentional device and the relational device) (Step S55: NO), returning to Step S52, and an embedment processing for the other device is to be performed. On the other hand, if the embedment has been completed for all the extracted field devices (the attentional device and the relational device) (Step S55: YES), processing of this flow chart is ended. As shown in FIG. 18, by the above-described processing, the control relation diagram 800 in which the current value of the main measurement value and the history diagram have been embedded is generated.

Figure 28:
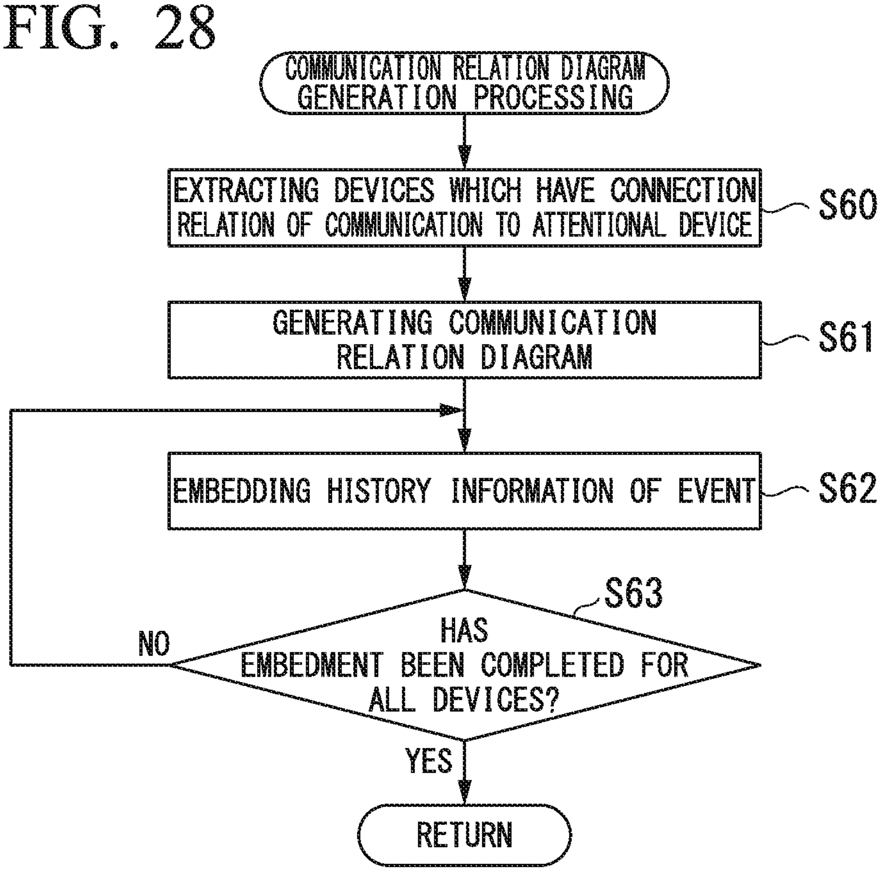
FIG. 28 is a flow chart illustrating a generation processing of a communication relation diagram performed by the information processor.

FIG. 28 is a flow chart illustrating a generation processing of a communication relation diagram performed by the information processor. FIG. 28 is a drawing illustrating the communication relation diagram generation processing of Step S25 of FIG. 24 in detail. As shown in FIG. 10, the communication relation diagram generator 31*d* extracts, as a relational device, field devices which have connection relation of communication to the attentional device (Step S60). Thereafter, the communication relation diagram generator 31*d* generates the communication relation diagram 400 shown in FIG. 9 (Step S61).

Next, the event history embedder 32*b* embeds the history information of the event (Step S62). Thereafter, if the embedment has not been completed for all the extracted field devices (the attentional device and the relational device) (Step S63: NO), returning to Step S62, and an embedment processing for the other device is to be performed. On the other hand, if the embedment has been completed for all the extracted field devices (the attentional device and the relational device) (Step S63: YES), processing of this flow chart is ended. As shown in FIG. 21, by the above-described processing, the communication relation diagram 900 in which the current value of the main measurement value and the history diagram have been embedded is generated.

The program for executing the flow chart shown in FIG. 24 to FIG. 28 may be stored in non-transitory storage medium, such as a CD-ROM. If this storage medium is used, for example, the program can be installed in the information processor 30.

In the present embodiment, although the display 12 changeably displays four relation diagrams (the positional relation diagram 600 (FIG. 12), the process relation diagram 700 (FIG. 15), the control relation diagram 800 (FIG. 18), and the communication relation diagram 900 (FIG. 21)), but not limited thereto. For example, the display 12 may changeably display at least two relation diagrams among the four relation diagrams.

The display 12 may scroll the history information of the measurement value of the attentional device and the history information of the measurement value of the relational device in conjunction with each other in accordance with an operation of the worker W with respect to the scroll key. Similarly, the display 12 may scroll the history information of the event which occurred in the attentional device and the history information of the event which occurred in the relational device in conjunction with each other in accordance with an operation of the worker W with respect to the scroll key.

As described above, the information processor 30 of the present embodiment includes the receiver 35*b*, the storage 34, the generator 31, and the transmitter 35*a*. The receiver 35*b* receives, from the terminal device 10, the information which represents the attentional device among the devices included in the plant. The storage 34 stores the relation information representing the relation of the devices. The generator 31 generates at least two relation diagrams, in which the attentional device and the relational device are shown, based on the information representing the attentional device and the relation information. The transmitter 35*a* transmits, to the terminal device 10, the at least two relation diagrams generated by the generator 31.

The terminal device 10 of the present embodiment includes the designator 11, the transmitter 13*a*, the receiver 13*b*, and the display 12. The designator 11 designates the attentional device among the devices included in the plant. The transmitter 13*a* transmits the information which represents the attentional device designated by the designator 11 to the information processor 30. The receiver 13*b* receives at least two relation diagrams, in which the attentional device and the relational device are shown, from the information processor 30. The display 12 displays at least two relation diagrams received by the receiver 13*b*.

Thereby, a device in which a factor of an abnormality exists can easily be specified even if a plant worker has a little knowledge and a little experience.

As used herein, the following directional terms “front, back, above, downward, right, left, vertical, horizontal, below, transverse, row and column” as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A plant operation support system which supports operation of a plant, the plant operation support system comprising:
- a mobile terminal device which is used by a worker; and
- an information processor which is connectable to the mobile terminal device through a network,
- wherein the mobile terminal device comprises:
  - a designator configured to designate an attentional device among devices included in a process control in the plant; and
  - a display configured to display at least two relation diagrams in which the attentional device designated by the designator and a relational device related to the attentional device are shown,
- wherein the information processor comprises:
  - a storage which stores, as relation information representing a relation of the devices, at least two of positional relation information representing a position of each of the devices, process relation information representing a connection relation of process of each of the devices, control relation information representing an input/output relation of control of each of the devices, and communication relation information representing a connection relation of communication of each of the devices; and
  - a generator configured to extract the relational device related to the attentional device designated by the designator based on a relationship represented by the at least two of the positional relation information, the process relation information, the control relation information, and the communication relation information, which are stored in the storage, the generator being configured to generate the at least two relation diagrams of a positional relation diagram representing a relation between a position where the attentional device is installed and a position where the relational device is installed, a process relation diagram representing a connection relation of process between the attentional device and the relational device, a control relation diagram representing an input/output relation of control between the attentional device and the relational device, and a communication relation diagram representing a connection relation of communication between the attentional device and the relational device; and
  - an embedder configured to associate first history information representing a history of an event and a measurement value of the attentional device with the attentional device, to associate second history information representing a history of an event and a measurement value of the relational device with the relational device, and to embed the first history information and the second history information into the relation diagram in at least one format of a table format and a graph format,
- wherein the mobile terminal device is configured to receive, from the information processor via the network, the at least two relation diagrams into which the first history information and the second history information are embedded, to display the at least two relation diagrams on the display, and to display a change part for changeably displaying the at least two relation diagrams on the display.

2. The plant operation support system according to claim 1,
- wherein if another attentional device which is different from the attentional device currently designated by the designator has been designated, the generator generates at least two relation diagrams based on information representing the other attentional device designated by the designator and the relation information stored in the storage, and the display displays the at least two relation diagrams generated by the generator.

3. The plant operation support system according to claim 1,
- wherein the embedder comprises:
- a measurement value history embedder configured to embed history information of a measurement value of the attentional device and history information of a measurement value of the at least one relational device;
- an event history embedder configured to embed history information of an event which has occurred in the attentional device and history information of an event which has occurred in the at least one relational device; and
- a current value embedder configured to embed a current measurement value of the attentional device and a current measurement value of the at least one relational device.

4. The plant operation support system according to claim 3,
- wherein the display is configured to display a scrolling part for scroll the history information of the measurement value, and
- wherein the display is configured to scroll the history information of the measurement value of the attentional device and the history information of the measurement value of the at least one relational device in conjunction with each other in accordance with an operation with respect to the scroll part.

5. The plant operation support system according to claim 4,
- wherein the display is configured to scroll the history information of the event of the attentional device and the history information of the event of the at least one relational device in conjunction with each other in accordance with an operation with respect to the scroll part.

6. The plant operation support system according to claim 1, wherein the generator comprises at least two of a positional relation diagram generator, a process relation diagram generator, a control relation diagram generator, and a communication relation diagram generator, wherein the positional relation diagram generator is configured to generate a positional relation diagram which represents a relation between a position where the attentional device is installed and a position where the relational device is installed, wherein the process relation diagram generator is configured to generate a process relation diagram which represents a connection relation of process between the attentional device and the relational device, wherein the control relation diagram generator is configured to generate a control relation diagram which represents an input/output relation of control between the attentional device and the relational device, and wherein the communication relation diagram generator is configured to generate a communication relation diagram which represents a connection relation of communication between the attentional device and the relational device.

7. An information processor which is connectable to a mobile terminal device through a network, the information processor comprising:

a receiver configured to receive, from the mobile terminal device, information representing an attentional device among devices included in a process control in a plant;

a storage which stores, as relation information representing a relation of the devices, at least two of positional relation information representing a position of each of the devices, process relation information representing a connection relation of process of each of the devices, control relation information representing an input/output relation of control of each of the devices, and communication relation information representing a connection relation of communication of each of the devices;

a generator configured to extract a relational device related to the attentional device represented by the information received by the receiver based on a relationship represented by the at least two of the positional relation information, the process relation information, the control relation information, and the communication relation information, which are stored in the storage, the generator being configured to generate the at least two relation diagrams of a positional relation diagram representing a relation between a position where the attentional device is installed and a position where the relational device is installed, a process relation diagram representing a connection relation of process between the attentional device and the relational device, a control relation diagram representing an input/output relation of control between the attentional device and the relational device, and a communication relation diagram representing a connection relation of communication between the attentional device and the relational device;

an embedder configured to associate first history information representing a history of an event and a measurement value of the attentional device with the attentional device, to associate second history information representing a history of an event and a measurement value of the relational device with the relational device, and to embed the first history information and the second history information into the relation diagram in at least one format of a table format and a graph format; and a transmitter configured to transmit, to the mobile terminal device, the at least two relation diagrams generated by the generator.

8. The information processor according to claim 7, wherein if the receiver has received information representing another attentional device which is different from the attentional device, the generator generates at least two relation diagrams based on the information representing the other attentional device received by the receiver and the relation information stored in the storage.

9. The information processor according to claim 7, wherein the embedder comprises:

a measurement value history embedder configured to embed history information of a measurement value of the attentional device and history information of a measurement value of the at least one relational device;

an event history embedder configured to embed history information of an event which has occurred in the attentional device and history information of an event which has occurred in the at least one relational device; and a current value embedder configured to embed a current measurement value of the attentional device and a current measurement value of the at least one relational device.

10. The information processor according to claim 7, wherein the generator comprises at least two of a positional relation diagram generator, a process relation diagram generator, a control relation diagram generator, and a communication relation diagram generator, wherein the positional relation diagram generator is configured to generate a positional relation diagram which represents a relation between a position where the attentional device is installed and a position where the relational device is installed, wherein the process relation diagram generator is configured to generate a process relation diagram which represents a connection relation of process between the attentional device and the relational device, wherein a control relation diagram generator is configured to generate a control relation diagram which represents an input/output relation of control between the attentional device and the relational device, and wherein a communication relation diagram generator is configured to generate a communication relation diagram which represents a connection relation of communication between the attentional device and the relational device.

11. A mobile terminal device which is connectable to an information processor through a network, the mobile terminal device comprising:

a designator configured to designate an attentional device among devices included in a process control in a plant;

a transmitter configured to transmit, to the information processor, information representing the attentional device designated by the designator;

a receiver configured to receive, from the information processor, at least two relation diagrams of a positional relation diagram representing a relation between a position where the attentional device is installed and a position where a relational device related to the attentional device is installed, a process relation diagram representing a connection relation of process between the attentional device and the relational device, a control relation diagram representing an input/output relation of control between the attentional device and the relational device, and a communication relation diagram representing a connection relation of communication between the attentional device and the relational device; and a display configured to display the at least two relation diagrams received by the receiver, wherein the receiver is configured to receive, from the information processor via the network, the at least two relation diagrams into which first history information representing a history of an event and a measurement value of the attentional device and second history information representing a history of an event and a measurement value of the relational device are embedded, and wherein the display is configured to display the at least two relation diagrams and a change part for changeably displaying the at least two relation diagrams.

12. The mobile terminal device according to claim 11, wherein history information of a measurement value of the attentional device and history information of a measurement value of at least one relational device are embedded in the relation diagram, wherein the display is configured to display a scrolling part for scroll the history information of the measurement value, and wherein the display is configured to scroll the history information of the measurement value of the attentional device and the history information of the measurement value of the at least one relational device in conjunction with each other in accordance with an operation with respect to the scroll part.

13. The mobile terminal device according to claim 12, wherein history information of an event which has occurred in the attentional device and history information of an event which has occurred in the at least one relational device are embedded in the relation diagram, wherein the display is configured to scroll the history information of the event of the attentional device and the history information of the event of the at least one relational device in conjunction with each other in accordance with an operation with respect to the scroll part.

14. A displaying method comprising:

designating, by a designator, an attentional device among devices included in a process control in a plant;

displaying, by a display, at least two relation diagrams in which the attentional device designated by the designator and a relational device related to the attentional device are shown;

storing into a storage, as relation information representing a relation of the devices, at least two of positional relation information representing a position of each of the devices, process relation information representing a connection relation of process of each of the devices, control relation information representing an input/output relation of control of each of the devices, and communication relation information representing a connection relation of communication of each of the devices;

extracting, by a generator, the relational device related to the attentional device designated by the designator based on a relationship represented by the at least two of the positional relation information, the process relation information, the control relation information, and the communication relation information, which are stored in the storage;

generating, by the generator, the at least two relation diagrams of a positional relation diagram representing a relation between a position where the attentional device is installed and a position where the relational device is installed, a process relation diagram representing a connection relation of process between the attentional device and the relational device, a control relation diagram representing an input/output relation of control between the attentional device and the relational device, and a communication relation diagram representing a connection relation of communication between the attentional device and the relational device;

associating, by an embedder, first history information representing a history of an event and a measurement value of the attentional device with the attentional device;

associating, by the embedder, second history information representing a history of an event and a measurement value of the relational device with the relational device;

embedding, by the embedder, the first history information and the second history information into the relation diagram in at least one format of a table format and a graph format; and displaying, by a display, the at least two relation diagrams generated by the generator and a change part for changeably displaying the at least two relation diagrams.

* * * * *